(12) United States Patent
Lu et al.

(10) Patent No.: US 12,175,898 B2
(45) Date of Patent: Dec. 24, 2024

(54) ARRAY SUBSTRATE, DISPLAY PANEL, AND METHOD OF TESTING ARRAY SUBSTRATE

(71) Applicants: Chengdu BOE Optoelectronics Technology Co., Ltd., Sichuan (CN); BOE Technology Group Co., Ltd., Beijing (CN)

(72) Inventors: Hongting Lu, Beijing (CN); Yuhsiung Feng, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 0 days.

(21) Appl. No.: 17/770,751

(22) PCT Filed: Jul. 20, 2021

(86) PCT No.: PCT/CN2021/107271
§ 371 (c)(1),
(2) Date: Jan. 26, 2023

(87) PCT Pub. No.: WO2023/000156
PCT Pub. Date: Jan. 26, 2023

(65) Prior Publication Data
US 2024/0153417 A1    May 9, 2024

(51) Int. Cl.
G09G 3/00     (2006.01)
G01R 31/26    (2020.01)
H01L 27/12    (2006.01)

(52) U.S. Cl.
CPC ......... *G09G 3/006* (2013.01); *G01R 31/2635* (2013.01); *H01L 27/124* (2013.01)

(58) Field of Classification Search
CPC ................ G09G 3/006; G09G 3/3208; G09G 2310/0297; G09G 2300/0426; G09G 2330/12; G01R 31/2635; H01L 27/124
See application file for complete search history.

(56) References Cited

U.S. PATENT DOCUMENTS

| | | | |
|---|---|---|---|
| 2019/0019440 A1* | 1/2019 | Lv ........................ | G09G 3/3677 |
| 2019/0156744 A1* | 5/2019 | Song .................... | G09G 3/3266 |
| 2020/0025820 A1* | 1/2020 | Zhao .................... | G09G 3/3225 |

* cited by examiner

*Primary Examiner* — Giovanni Astacio-Oquendo
*Assistant Examiner* — Zannatul Ferdous
(74) *Attorney, Agent, or Firm* — Intellectual Valley Law, P.C.

(57) ABSTRACT

An array substrate includes N number of testing signal lines, N being an integer greater than 1; N number of first control signal lines; N number of second control signal lines; M number of first switching transistors; and M number of second switching transistors. A second electrode of a m-th first switching transistor is connected to a first electrode of a m-th second switching transistor, 1≤m≤M. A n-th testing signal line is connected to first electrodes of (kN+n)-th first switching transistors, 1≤n≤N, 0≤k<M/N. A n-th first control signal line is connected to gate electrodes of $(kN^2+((n-1)*N)+1)$-th to $(kN^2+n*N)$-th first switching transistors, 0≤k<M/N. A n-th second control signal line is connected to gate electrodes of the (kN+n)-th second switching transistors. A second electrode of the m-th second switching transistor is connected to a m-th array substrate signal line.

20 Claims, 18 Drawing Sheets

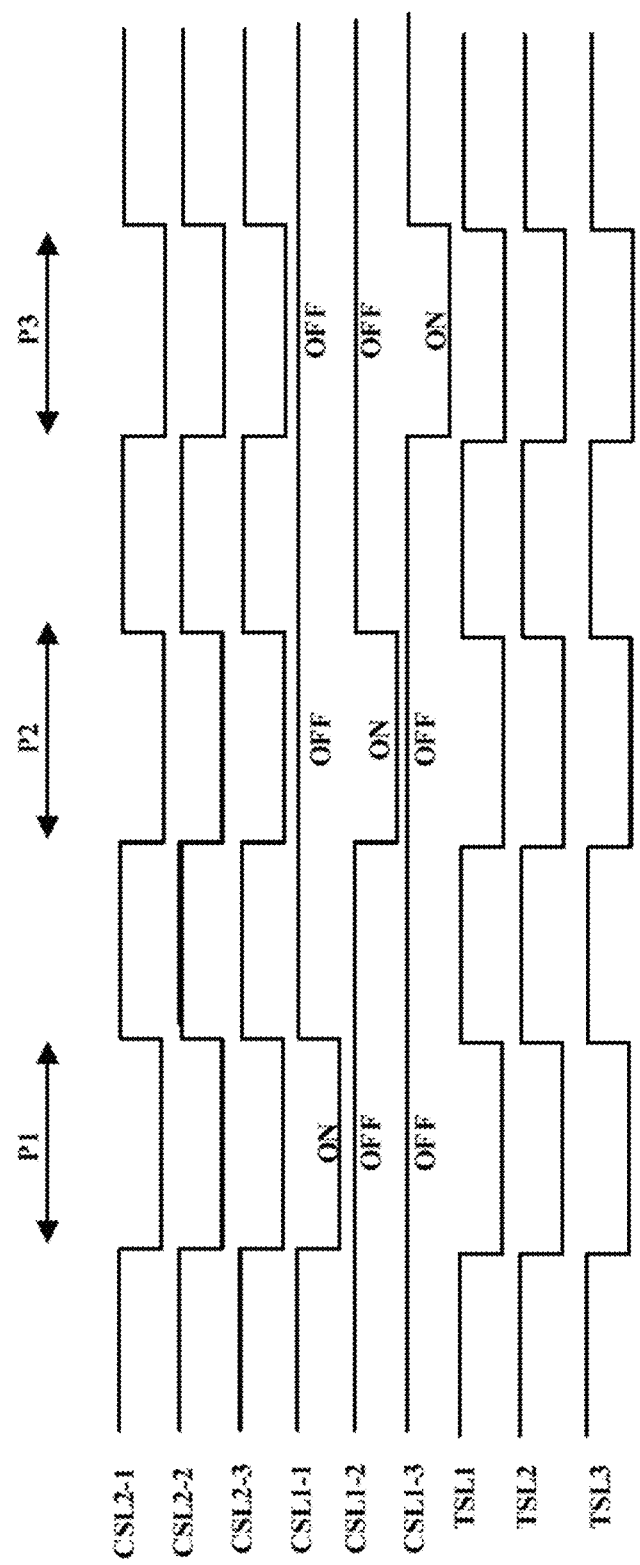

ARRAY SUBSTRATE, DISPLAY PANEL, AND METHOD OF TESTING ARRAY SUBSTRATE

CROSS-REFERENCE TO RELATED APPLICATION

This application is a national stage application under 35 U.S.C. § 371 of International Application No. PCT/CN2021/107271, filed Jul. 20, 2021, the contents of which are incorporated by reference in the entirety.

TECHNICAL FIELD

The present invention relates to display technology, more particularly, to an array substrate, a display panel, and a method of testing an array substrate.

BACKGROUND

Typically, an aging process is performed on an. Organic Light Emitting Diode (OLED) device after the OLED device is formed, in order to eliminate bright spots and improve transistor stability.

SUMMARY

In one aspect, the present disclosure provides an array substrate, comprising N number of testing signal lines, N being an integer greater than 1; N number of first control signal lines; N number of second control signal lines; M number of first switching transistors, M being an integer greater than N; and M number of second switching transistors; wherein a second electrode of a m-th first switching transistor is connected to a first electrode of a m-th second switching transistor, $1 \leq m \leq M$; a n-th testing signal line is connected to first electrodes of (kN+n)-th first switching transistors, $1 \leq n \leq N$, $0 \leq k < M/N$; a n-th first control signal line is connected to gate electrodes of $(kN^2+((n-1)*N)+1)$-th to $(kN^2+n*N)$-th first switching transistors, $0 \leq k < M/N$; a n-th second control signal line is connected to gate electrodes of the (kN+n)-th second switching transistors; and a second electrode of the m-th second switching transistor is connected to a m-th array substrate signal line.

Optionally, M is an integer multiple of N.

Optionally, N is a total number of different colors of subpixels in an array substrate comprising M number of array substrate signal lines respectively connected to second electrodes of the M number of second switching transistors.

Optionally, N=3.

Optionally, the array substrate comprises a first-first control signal line, a second-first control signal line, and a third-first control signal line; a first-second control signal line, a second-second control signal line, and a third-second control signal line; a first testing signal line, a second testing signal line, and a third testing signal line; a first-first switching transistor, a second-first switching transistor, a third-first switching transistor, a fourth-first switching transistor, a fifth-first switching transistor, a sixth-first switching transistor, a seventh-first switching transistor, an eighth-first switching transistor, and a ninth-first switching transistor; and a first-second switching transistor, a second-second switching transistor, a third-second switching transistor, a fourth-second switching transistor, a fifth-second switching transistor, a sixth-second switching transistor, a seventh-second switching transistor, an eighth-second switching transistor, and a ninth-second switching transistor; wherein the first testing signal line is connected to first electrodes of the first-first switching transistor, the fourth-first switching transistor, and the seventh-first switching transistor; the second testing signal line is connected to first electrodes of the second-first switching transistor, the fifth-first switching transistor, and the eighth-first switching transistor; the third testing signal line is connected to first electrodes of the third-first switching transistor, the sixth-first switching transistor, and the ninth first switching transistor; the first-first control signal line is connected to gate electrodes of the first-first switching transistor, the second-first switching transistor, and the third-first switching transistor; the second-first control signal line is connected to gate electrodes of the fourth-first switching transistor, the fifth-first switching transistor, and the sixth-first switching transistor; the third-first control signal line is connected to gate electrodes of the seventh-first switching transistor, an eighth-first switching transistor, and the ninth-first switching transistor; the first-second control signal line is connected to gate electrodes of the first-second switching transistor, the fourth-second switching transistor, and the seventh-second switching transistor; the second-second control signal line is connected to gate electrodes of the second-second switching transistor, the fifth-second switching transistor, and the eighth-second switching transistor; and the third-second control signal line is connected to gate electrodes of the third second switching transistor, the sixth-second switching transistor, and the ninth-second switching transistor.

Optionally, the array substrate comprises a semi-conductor material layer, wherein the semi-conductor material layer comprises active layers of the M number of first switching transistors and the M number of second switching transistors; a first conductive layer, wherein the first conductive layer comprises gate electrodes of the M number of first switching transistors and the M number of second switching transistors; a second conductive layer, wherein the second conductive layer comprises M number of first connecting lines respectively connecting first electrodes of the M number of first switching transistors to corresponding testing signal lines, and M number of second connecting lines respectively connecting second electrodes of the M number of first switching transistors to first electrodes of the M number of second switching transistors; and a first signal line layer, wherein the first signal line layer comprises first sub-layers respectively of the N number of testing signal lines, the N number of first control signal lines, the N number of second control signal lines, first electrodes and second electrodes of the M number of first switching transistors, and first electrodes and second electrodes of the M number of second switching transistors.

Optionally, the array substrate further comprises an insulating layer between the first conductive layer and the second conductive layer; an inter-layer dielectric layer between the second conductive layer and the first signal line layer; and a planarization layer between on a side of the first signal line layer away from the inter-layer dielectric layer; wherein a respective first electrode of a respective first switching transistor is connected to a respective first connecting line through a via extending through the inter-layer dielectric layer; a respective first sub-layer of a respective testing signal line is connected to corresponding first connecting lines respective through vias extending through the inter-layer dielectric layer; and a respective first control signal line is connected to corresponding gate electrodes of corresponding first switching transistors respectively through vias extending through the inter-layer dielectric layer and the insulating layer.

Optionally, a respective second electrode of a respective first switching transistor is connected to a respective second connecting line through a via extending through the inter-layer dielectric layer; a respective first electrode of a respective second switching transistor is connected to the respective second connecting line through a via extending through the inter-layer dielectric layer; and a respective second control signal line is connected to corresponding gate electrodes of corresponding second switching transistors respectively through vias extending through the inter-layer dielectric layer and the insulating layer.

Optionally, the array substrate further comprises a second signal line layer, wherein the second signal line layer comprises second sub-layers respectively of N number of testing signal, lines; and a planarization layer between the first signal line layer and the second signal line layer; wherein a respective second sub-layer of a respective testing signal line is connected to a respective first sub-layer of the respective testing signal line through a via extending through the planarization layer.

Optionally, a respective first electrode of a respective first switching transistor is connected to a respective active layer of the respective first switching transistor through a via extending through the inter-layer dielectric layer and the insulating layer; a respective second electrode of a respective first switching transistor is connected to the respective active layer of the respective first switching transistor through a via extending through the inter-layer dielectric layer and the insulating layer; a respective first electrode of a respective second switching transistor is connected to a respective active layer of the respective second switching transistor through a via extending through the inter-layer dielectric layer and the insulating layer; and a respective second electrode of a respective second switching transistor is connected to the respective active layer of the respective second switching transistor through a via extending through the inter-layer dielectric layer and the insulating layer.

In another aspect, the present disclosure provides a display panel, comprising the array substrate described herein or fabricated by a method described herein, and M number of array substrate signal lines respectively connected to second electrodes of the M number of second switching transistors.

Optionally, the M number of array substrate signal lines are M number of data lines.

In another aspect, the present disclosure provides a method of testing an array substrate, comprising providing a testing circuit comprising N number of testing signal lines, N being an integer greater than 1; N number of first control signal N number of second control signal lines; M number of first switching transistors, M being an integer greater than N; and M number of second switching transistors; connecting a second electrode of a m-th first switching transistor to a first electrode of a m-th second switching transistor, $1 \leq m \leq M$; connecting a n-th testing signal line to first electrodes of (kN+n)-th first switching transistors, $1 \leq n \leq N$, $0 \leq k < M/N$; connecting a n-th first control signal line to gate electrodes of $(kN^2+(n-1)*N)+1)$-th to $(kN^2+n*N)$-th first switching transistors, $0 \leq k < M/N$; connecting a n-th second control signal line to gate electrodes of the (kN+n)-th second switching transistors; and connecting a second electrode of the m-th second switching transistor to a m-th array substrate signal line.

Optionally, the testing is performed in a cycle comprising N number of period; wherein the method comprises, in a n-th period, providing a turning-on voltage signal to the n-th first control signal line while providing turning-off voltage signals to first control signal lines other than the n-th first control signal line, providing turning-on voltage signals respectively to the N number of second control signal lines, and providing testing voltage signals respectively to the N number of testing signal lines, thereby providing the testing voltage signals respectively to array substrate signal lines respectively connected to second electrodes of $(kN^2+((n-1)*N)+1)$-th to $(kN^2+n*N)$-th second switching transistors.

Optionally, N=3; and the cycle comprises a first period, a second period, and a third period.

Optionally, in the first period, the method comprises providing a turning-on voltage signal to a first-first control signal line while providing turning-off voltage signals to a, second-first control signal line and a third-first control signal line, providing turning-on voltage signals respectively to a first-second control signal line, a second-second control signal line, and a third-second control signal line, and providing testing voltage signals respectively to a first testing signal line, a second testing signal line, and a third testing signal line, thereby providing the testing voltage signals respectively to array substrate signal lines respectively connected to second electrodes of a first-second switching transistor, a second-second switching transistor, and a third-second switching transistor; in the second period, the method comprises providing a turning-on voltage signal to the second-first control signal line while providing turning-off voltage signals to the first-first control signal line and the third-first control signal line, providing turning-on voltage signals respectively to the first-second control signal line, the second-second control signal line, and the third-second control signal line, and providing testing voltage signals respectively to the first testing signal line, the second testing signal line, and the third testing signal line, thereby providing the testing voltage signals respectively to array substrate signal lines respectively connected to second electrodes of a fourth-second switching transistor, a fifth-second switching transistor, and a sixth-second switching transistor; and in the third period, the method comprises providing a turning-on voltage signal to the third-first control signal line while providing turning-off voltage signals to the first-first control signal line and the second-first control signal line, providing turning-on voltage signals respectively to the first-second control signal line, the second-second control signal line, and the third-second control signal line, and providing testing voltage signals respectively to the first testing signal line, the second testing signal line, and the third testing signal line, thereby providing the testing voltage signals respectively to array substrate signal lines respectively connected to second electrodes of a seventh-second switching transistor, an eighth-second switching transistor, and a ninth-second switching transistor.

Optionally, the testing is performed in a cycle comprising N number of period, a respective period comprising N number of sub-period; wherein the method comprises, in a n-th period, providing a turning-on voltage signal to the n-th second control signal line while providing turning-off voltage signals to second control signal lines other than the n-th second control signal line, providing testing voltage signals respectively to the N number of testing signal lines; in a n-th sub-period of the n-th period, providing a turning-on voltage signal to the n-th first control signal line while providing turning-off voltage signals to first control signal lines other than the n-th first control signal line, thereby providing the testing voltage signals respectively to array substrate signal lines connected to second electrodes of $(kN^2+((n-1)*N)+n)$-th second switching transistors.

Optionally, N=3; the cycle comprises a first period, a second period, and a third period; the first period comprises a first-first sub-period, a second-first sub-period, and a third-first sub-period; the second period comprises a first-second sub-period, a second-second sub-period, and a third-second sub-period; and the third period comprises a first-third sub-period, a second-third sub-period, and a third-third sub-period.

Optionally, in the first period, the method comprises providing a turning-on voltage signal to a first-second control signal line while providing turning-off voltage signals to a second-second control signal line and a third-second control signal line, providing testing voltage signals respectively to a first testing signal line, a second testing signal line, and a third testing signal line; in the first-first sub-period, the method comprises providing a turning-on voltage signal to a first-fast control signal line while providing, turning-off voltage signals to a second-first control signal line and a third-first control signal line, thereby providing the testing voltage signals respectively to array substrate signal lines connected to a second electrode of a first-second switching transistor; in the second-first sub-period, the method comprises providing a turning-on voltage signal to the second-first control signal line while providing turning-off voltage signals to the first-first control signal line and the third-first control signal line, thereby providing the testing voltage signals respectively to array substrate signal lines connected to a second electrode of a fourth-second switching transistor; in the third-first sub-period, the method comprises providing a turning-on voltage signal to the third-first control signal line while providing turning-off voltage signals to the first-first control signal line and the second-first control, signal line, thereby providing the testing voltage signals respectively to array substrate signal lines connected to a second electrode of a seventh-second switching transistor; in the second period, the method comprises providing a turning-on voltage signal to the second-second control signal line while providing turning-off voltage signals to the first-second control signal line and the third-second control signal hue, providing testing voltage signals respectively to the first testing signal line, the second testing signal line, and the third testing signal line; in the first-second sub-period, the method comprises providing a turning-on voltage signal to the first-first control signal line while providing turning-off voltage signal s to the second-first control signal line and the third-first control signal line, thereby providing the testing voltage signals respectively to array substrate signal lines connected to a second electrode of a second-second switching transistor; in the second-second sub-period, the method comprises providing a turning-on voltage signal to the second-first control signal line while providing turning-off voltage signals to the first-first control signal line and the third-first control signal line, thereby providing the testing voltage signals respectively to array substrate signal, lines connected to a second electrode of a fifth-second switching transistor; in the third-second sub-period, the method comprises providing a turning-on voltage signal to the third-first control signal line while providing turning-off voltage signals to the first-first control signal line and the second-first control signal line, thereby providing the testing voltage signals respectively to array substrate signal lines connected to a second electrode of an eighth-second switching transistor; in the third period the method comprises providing a turning-on voltage signal to the third-second control signal line while providing turning-off voltage signals to the first-second control signal line and the second-second control signal line, providing testing voltage signals respectively to the first testing signal line, the second testing signal line, and the third testing signal line; in the first-third sub-period, the method comprises providing a turning-on voltage signal to the first-first control signal line while providing turning-off voltage signals to the second-first control signal line and the third-first control signal line, thereby providing the testing voltage signals respectively to array substrate signal lines connected to a second electrode of a third-second switching transistor; in the second-third sub-period, the method comprises providing a turning-on voltage signal to the second-first control signal line while providing turning-off voltage signals to the first-first control signal line and the third-first control signal line, thereby providing the testing Voltage signals respectively to array substrate signal lines connected to a second electrode of a sixth-second switching transistor; and in the third-third sub-period, the method comprises providing a turning-on voltage signal to the third-first control signal line while providing turning-off voltage signals to the first-first control signal line and the second-first control signal line, thereby providing the testing voltage signals respectively to array substrate signal lines connected to a second electrode of a ninth-second switching transistor.

Optionally, the array substrate further comprises M number of array substrate signal lines respectively connected to second electrodes of the M number of second switching transistors, wherein the M number of array substrate signal lines are M number of data lines.

BRIEF DESCRIPTION OF THE FIGURES

The following drawings are merely examples for illustrative purposes according to various disclosed embodiments and are not intended to limit the scope of the present invention.

FIG. 5 is a timing diagram of operating a testing circuit in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alga, an array substrate, a display panel, and a method of testing an array substrate that substantially obviate one or more of the problems due to limitations and disadvantages of the related art. In one aspect, the present disclosure provides an array substrate. In some embodiments, the array substrate includes N number of testing signal lines. N being an integer greater than 1; N number of first control signal lines; N number of second control signal lines; M number of first switching transistors, M being an integer greater than N; and M number of second switching transistors. In some embodiments, a second electrode of a m-th first switching transistor is connected to a first electrode of a m-th second switching transistor, $1 \leq m \leq M$. Optionally, a n-th testing signal line is connected to first electrodes of (kN+n)-th first switching transistors, $1 \leq n \leq N$, $0 \leq k < M/N$. Optionally, a n-th first control sural line is connected to gate electrodes of $(kN^2+((n-1)*N)+1)$-th to $(kN^2+n*N)$-th first switching transistors, $0 \leq k < M/N$. Optionally, a n-th second control signal line is connected to gate electrodes of the (kN+u)-th second switching transistors Optionally, a second electrode of the m-th second switching transistor is connected to a m-th array substrate signal line.

Figure 1A:
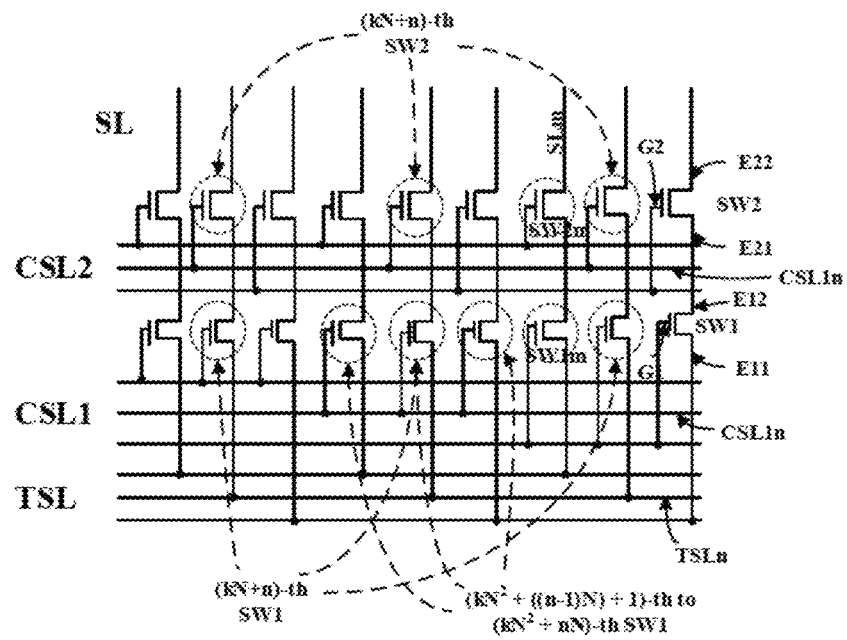
FIG. 1A is a circuit diagram of a testing circuit in some embodiments according to the present disclosure.

FIG. 1A is a circuit diagram of a testing circuit in some embodiments according to the present disclosure. Referring to FIG. 1A, the testing circuit in the array substrate in some embodiments includes N number of testing signal lines TSL, N being an integer greater than 1; N number of first control signal lines CSL1; N number of second control signal lines CSL2; M number of first switching transistors SW1, M being an integer greater than N; and M number of second switching transistors SW2. A respective first switching transistor in FIG. 1A is denoted with a first electrode E11 (e.g., a source electrode), a second electrode E12 (e.g., a drain electrode), and a gate electrode G1. A respective second switching transistor in FIG. 1A is denoted with a first electrode E21 (e.g., a source electrode), a second electrode E22 (e.g., a drain electrode), and a gate electrode G2. As shown in FIG. 1A, in some embodiments, a second electrode E12 of a m-th first switching transistor SW1m is connected to a first electrode E21 of a m-th second switching transistor SW2m. Optionally, $1 \leq m \leq M$. Optionally, a n-th testing signal line TSLn is connected to first electrodes of (kN+n)-th first switching transistors. Optionally, $1 \leq n \leq N$, $0 \leq k < M/N$. Optionally, $0 \leq k \leq ((M/N)-1)$. Optionally, a n-th first control signal line CSL1n is connected to gate electrodes of $(kN^2+((n-1)*N)+1)$-th to $(kN^2+n*N)$-th first switching transistors, $0 \leq k < M/N$. Optionally, a n-th second control signal line CSL2n is connected to gate electrodes of the (kN+n)-th second switching transistors. Optionally, a second electrode E22 of the m-th second switching transistor is connected to a in-th array substrate signal line SLm. Optionally, M is a positive integer, N is a positive integer, in is a positive integer, n is a positive integer, k is a positive integer. Optionally, M is an integer multiple of N.

In some embodiments, N is a total number of different colors of subpixels in an array substrate comprising M number of array substrate signal lines respectively connected to second electrodes of the M number of second switching transistors. In one example, the array substrate includes a red subpixel, a gem subpixel, and a blue subpixel, and N=3. In another example, the array substrate includes a red subpixel, a green subpixel, a blue subpixel, and a white subpixel, and N=4.

In one example, N=2. In another example, N=3. In another example, N=4. In another example, N=5. In another example, N=6.

Figure 1B:
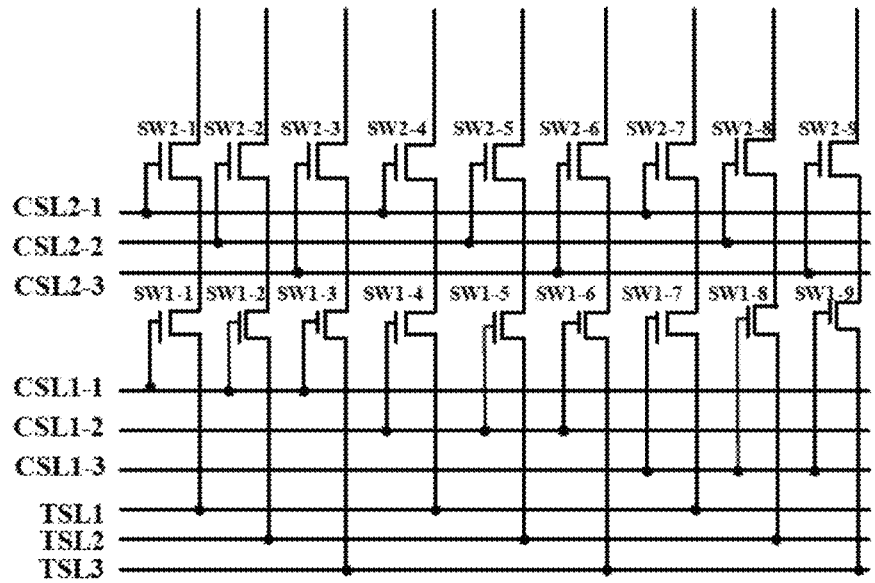
FIG. 1B is a circuit diagram of a testing circuit in some embodiments according to the present disclosure.

FIG. 1B is a circuit diagram of a testing circuit in some embodiments according to the present disclosure. FIG. 1B illustrates an example of the testing circuit in which N=3. Referring to FIG. 1B, the testing circuit in some embodiments includes a first-first control signal line CSL1-1, a second-first control signal line CSL1-2, and a third-first control signal lure CSL1-3; a first-second control signal line CSL2-1, a second-second control signal line CSL2-2, and a third-second control signal line CSL2-3; a first testing signal line TSL1, second testing signal line TSL2, and a third testing signal lure TSL3, a first-first switching transistor SW1-1, a second-first switching transistor SW1-2, a third-first switching transistor SW1-3, a fourth-first switching transistor SW1-4, a fifth-first switching transistor SW1-5, a sixth-first switching transistor SW1-6, a seventh-first switching transistor SW1-7, an eighth-first switching transistor SW1-8, and a ninth-first switching transistor SW1-9; and a first-second switching transistor SW2-1, a second-second switching transistor SW2-2, a third-second switching transistor SW2-3, a fourth-second switching transistor SW2-4, a fifth-second switching transistor SW2-5, a sixth-second switching transistor SW2-6, a seventh-second switching transistor SW2-7, an eighth-second switching transistor SW2-8, and a ninth-second switching transistor SW2-9.

Referring to FIG. 1A and FIG. 1B, in some embodiments, the first testing signal line TSL1 is connected to first electrodes of the first-first switching transistor SW1-1, the fourth-fast switching transistor SW1-4, and the seventh-first switching transistor SW1-7. The second testing signal line TSL2 is connected to first electrodes of the second-first switching transistor SW1-2, the fifth-first switching transistor SW1-5, and the eighth-first switching transistor SW1-8.

The third testing signal line TSL3 is connected to first electrodes of the third-first switching transistor SW1-3, the sixth-first switching transistor SW1-6, and the ninth-first switching transistor SW1-9. The first-first control signal line CSL1-1 is connected to gate electrodes of the first-first switching transistor SW1-1, the second-first switching transistor SW1-2, and the third-first switching transistor SW1-3. The second-first control signal line CSL1-2 is connected to gate electrodes of the fourth-first switching transistor SW1-4, the fifth-first switching transistor SW1-5, and the sixth-first switching transistor SW1-6. The third-first control signal line CSL1-3 is connected to gate electrodes of the seventh-first switching transistor SW1-7 an eighth-first switching transistor SW1-8, and the ninth-first switching transistor SW1-9. The first-second control signal line CSL2-1 is connected to gate electrodes of the first-second switching transistor SW2-1, the fourth-second switching transistor SW2-4 and the seventh-second switching transistor SW2-7. The second-second control signal line CSL2-2 is connected to gate electrodes of the second-second switching transistor SW2-2, the fifth-second switching transistor SW2-5, and the eighth-second switching transistor SW2-8. The third-second control signal line CSL2-3 is connected to gate electrodes of the third-second switching transistor SW2-3, the sixth-second switching transistor SW2-6, and the ninth-second switching transistor SW2-9.

Figure 2A:
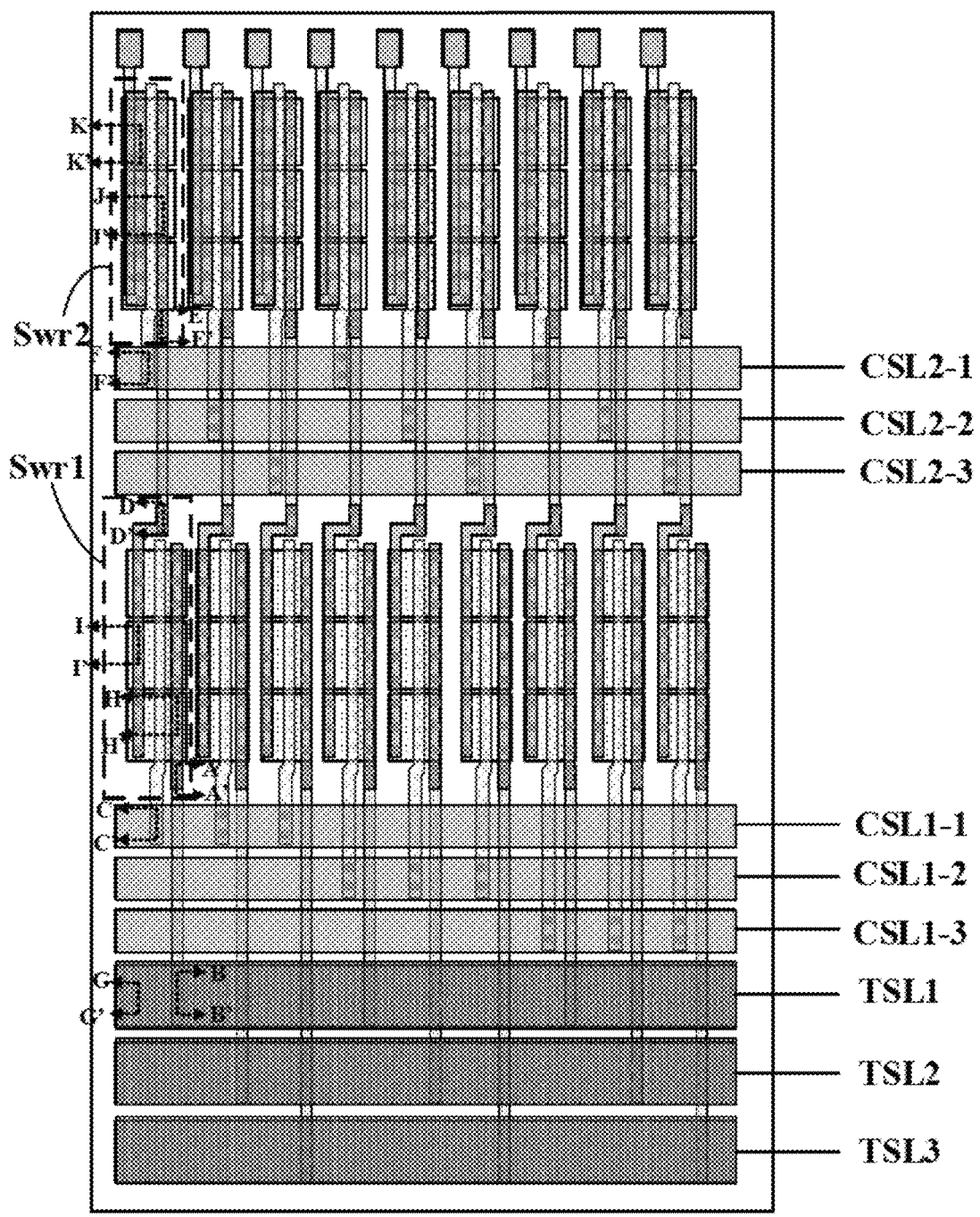
FIG. 2A is a schematic diagram of the structure of a testing circuit in some embodiments according to the present disclosure.
Figure 2B:
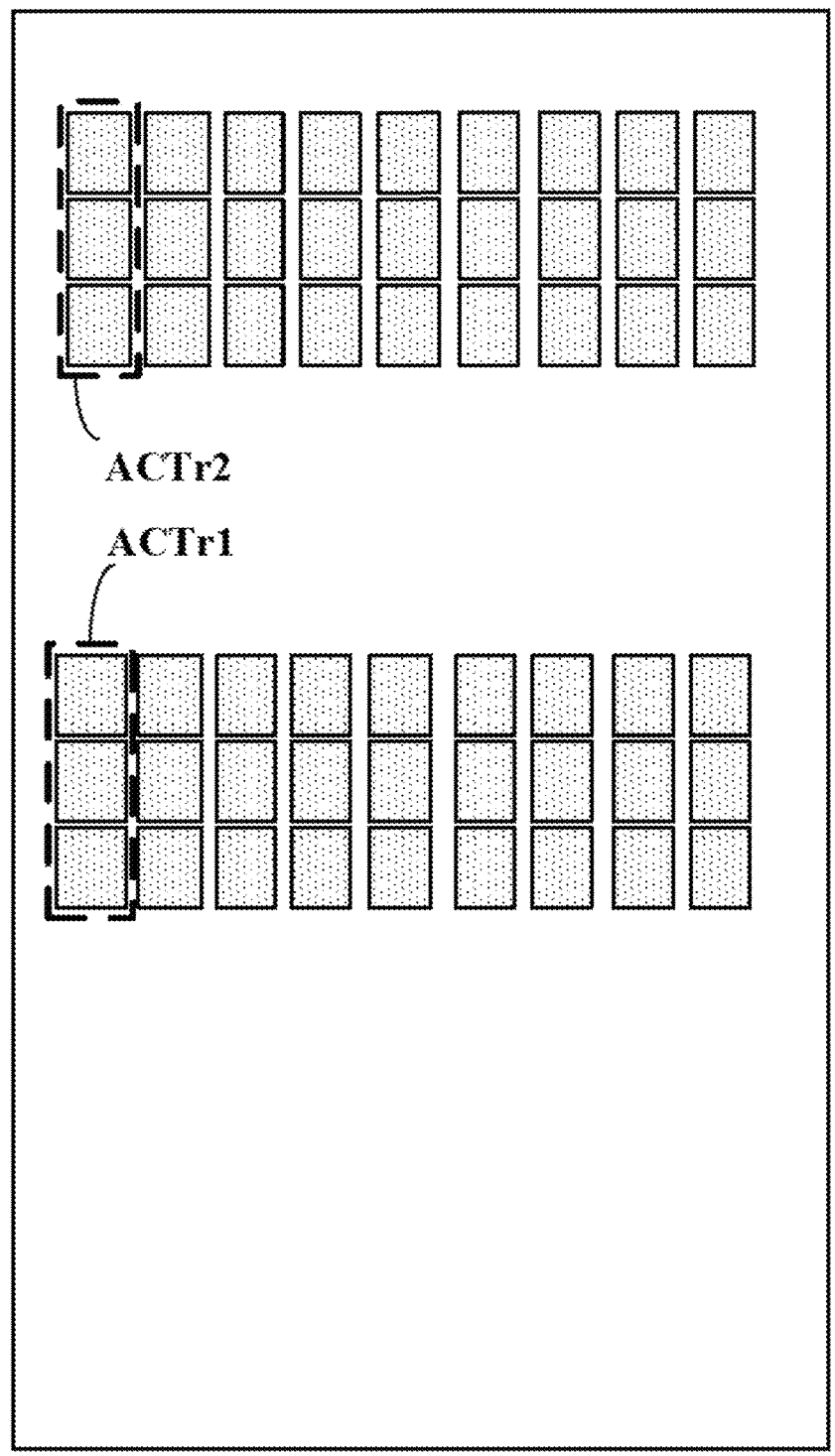
FIG. 2B is a schematic diagram of the structure of a semiconductor material layer in a testing circuit in some embodiments according to the present disclosure.
Figure 2C:
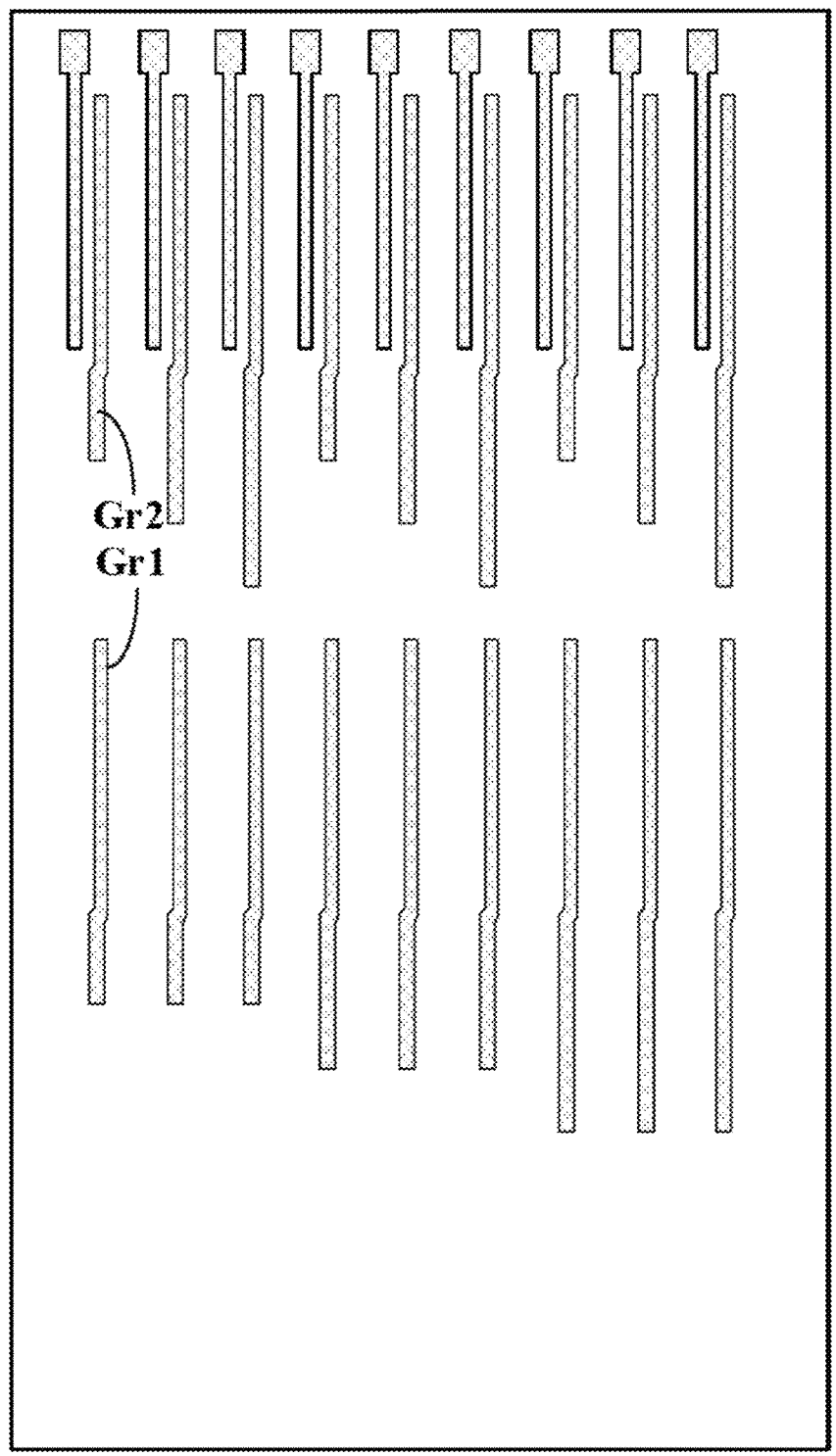
FIG. 2C is a schematic diagram of the structure of a first conductive layer in a testing circuit in some embodiments according to the present disclosure.
Figure 2D:
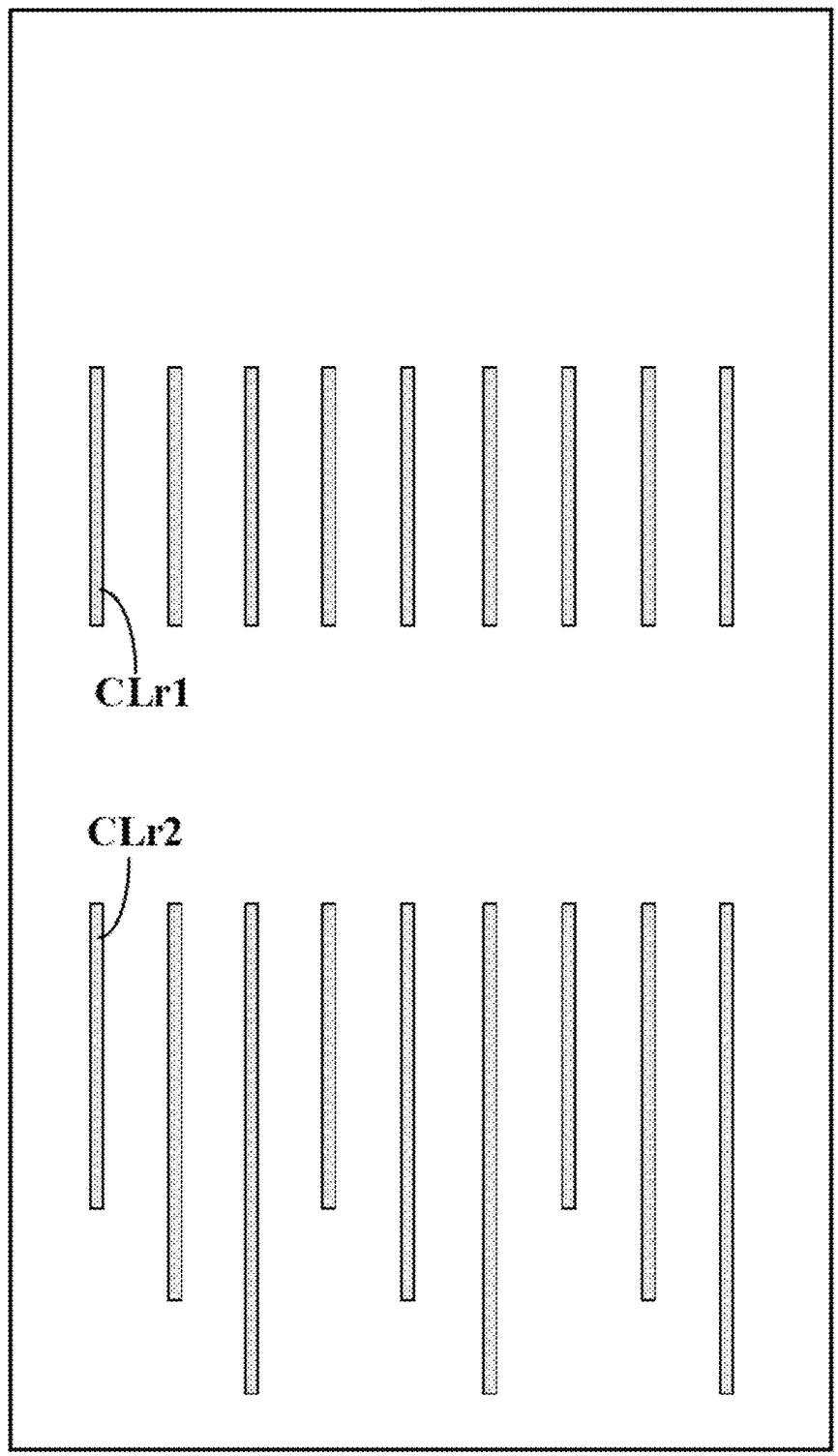
FIG. 2D is a schematic diagram of the structure of a second conductive layer in a testing circuit in some embodiments according to the present disclosure.
Figure 2E:
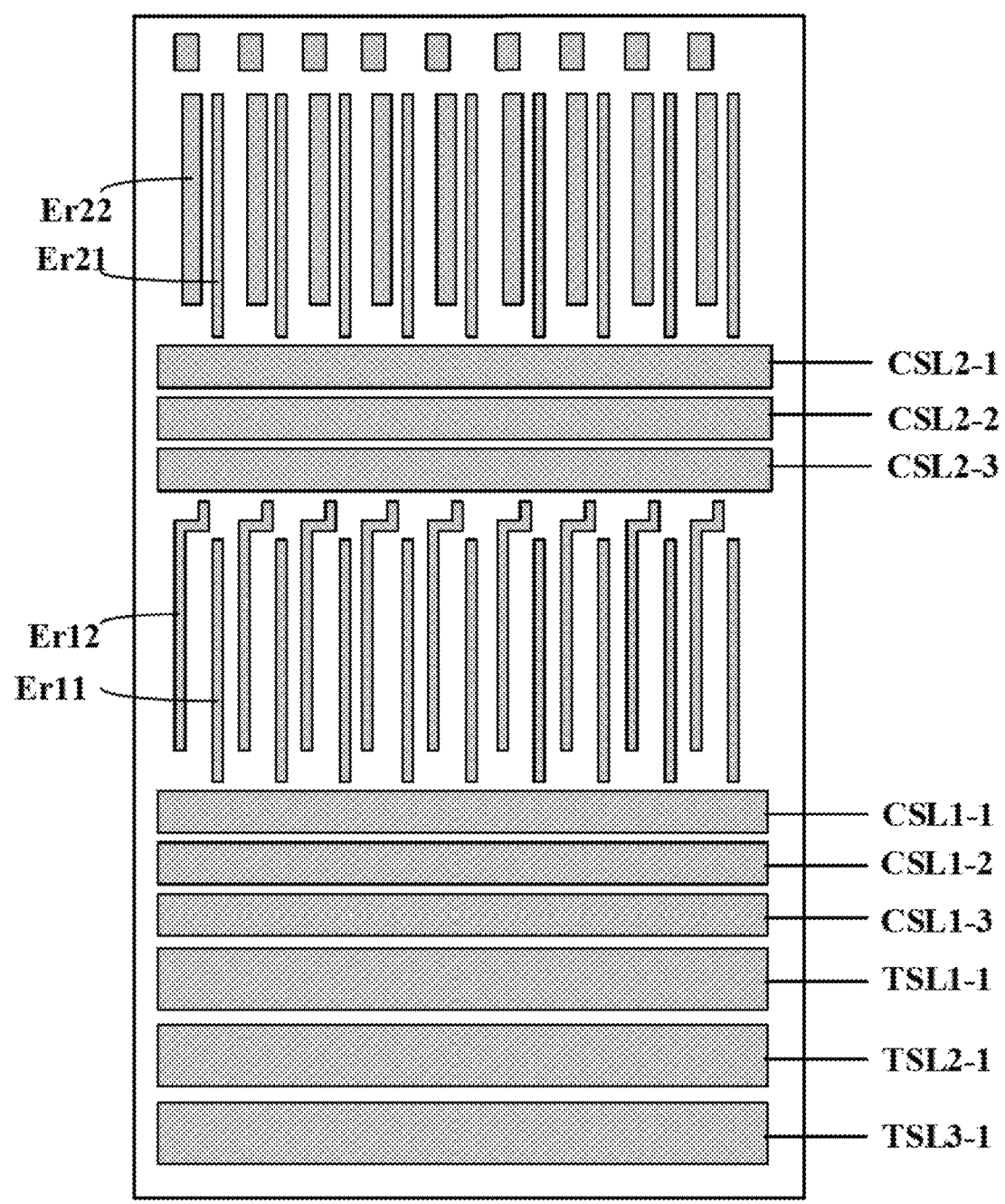
FIG. 2E is a schematic diagram of the structure of a first signal line layer in a testing circuit in some embodiments according to the present disclosure.
Figure 2F:
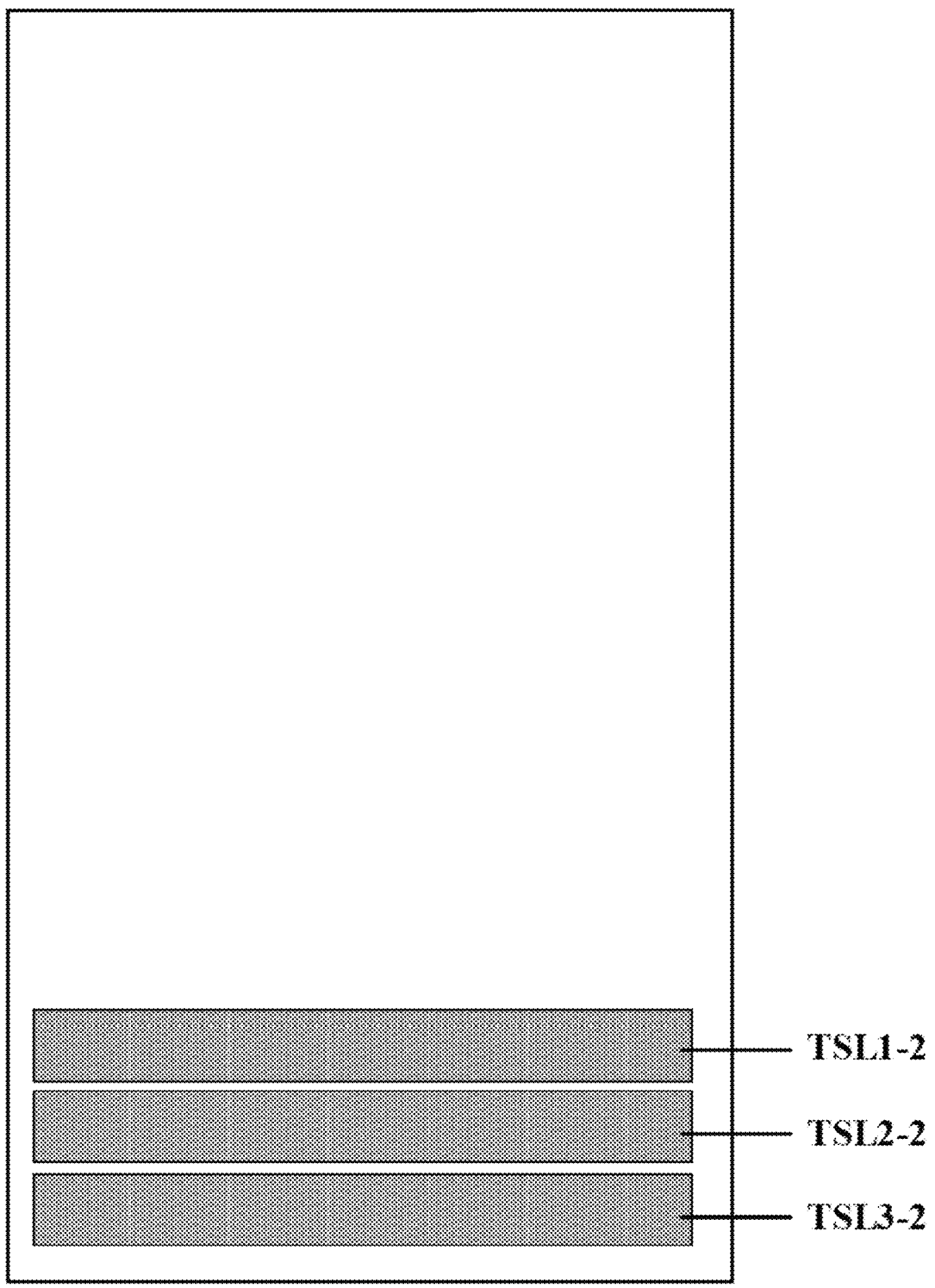
FIG. 2F is a schematic diagram of the structure of a second signal line layer in a testing circuit in some embodiments according to the present disclosure.

In some embodiments, the testing circuit includes a semiconductor material layer, a first conductive layer, a second conductive layer, a first signal line layer, and a second signal line layer. FIG. 2A is a schematic diagram of the structure of a testing circuit in some embodiments according to the present disclosure. FIG. 2B is a schematic diagram of the structure of a semiconductor material layer in a testing circuit in some embodiments according to the present disclosure. FIG. 2C is a schematic diagram of the structure of a first conductive layer in a testing circuit in some embodiments according to the present disclosure. FIG. 2D is a schematic diagram of the structure of a second conductive layer in a testing circuit in some embodiments according to the present disclosure. FIG. 2E is a schematic diagram of the structure of a first signal line layer in a testing circuit in some embodiments according to the present disclosure. FIG. 2F is a schematic diagram of the structure of a second signal line layer in a testing circuit in some embodiments according to the present disclosure.

Referring to FIG. 2A, a respective first switching transistor SWr1 and a respective second switching transistor SWr2 are denoted. The first testing signal line TSL1, the second testing signal line TSL2, the third testing signal line TSL3, the first-first control signal line CSL1-1, the second-first control signal line CSL1-2, the third-first control signal line CSL1-3, the first-second control signal line CSL2-1, the second-second control signal line CSL2-2, and the third-second control signal line CSL2-3 are also denoted in FIG. 2A.

Referring to FIG. 2A and FIG. 2B, the semiconductor material layer in some embodiments includes active layers of the M number of first switching transistors and the M number of second switching transistors. A respective active layer of a respective first switching transistor SWr1 is denoted as ACTr1 in FIG. 2B, and a respective active layer of a respective second switching transistor SWr2 is denoted as ACTr2 in FIG. 2B.

Referring to FIG. 2A and FIG. 2C, the first conductive layer in some embodiments includes gate electrodes of the M number of first switching transistors and the M number of second switching transistors. A respective gate electrode of a respective first switching transistor SWr1 is denoted as Gr1 in FIG. 2C, and a respective gate electrode of a respective second switching transistor SWr2 is denoted as Gr2 in FIG. 2C.

Referring to FIG. 2A and FIG. 2D, the second conductive layer in some embodiments includes M number of first connecting lines respectively connecting first electrodes of the M number of first switching transistors to corresponding testing signal lines, and M number of second connecting lines respectively connecting second electrodes of the M number of first switching transistors to first electrodes of the M number of second switching transistors. A respective first connecting line is denoted as CLr1 in FIG. 2D, and a respective second connecting, line is denoted as CLr2 in FIG. 2D.

Referring to FIG. 2A and FIG. 2E, the first signal line layer in some embodiments includes first sub-layers respectively the N number of testing signal lines (e.g., TSL1-1, TSL2-1, and TSL3-1), the N number of first control signal lines (e.g., CSL1-1, CSL1-2, and CSL1-3), the N number of second control signal lines (e.g., CSL2-1, CSL2-2, and CSL2-3), first electrodes and second electrodes of the M number of first switching transistors, and first electrodes and second electrodes of the M number of second switching transistors. A respective first electrode and a respective second electrode of a respective first switching transistor SWr1 are denoted as Er11 and Er12 in FIG. 2E, a respective first electrode and a respective second electrode of a respective second switching transistor SWr2 are denoted as Er21 and Er22 in FIG. 2E.

In some embodiments, the testing circuit further includes a second signal line layer. FIG. 2F is a schematic diagram of the structure of a second signal line layer in a testing circuit in some embodiments according to the present disclosure. Referring to FIG. 2A and FIG. 2F, the second signal line layer in some embodiments includes second sub-layers respectively of the N number of testing signal lines (e.g., TSL1-2, TSL2-2, and TSL3-2).

Figure 3A:
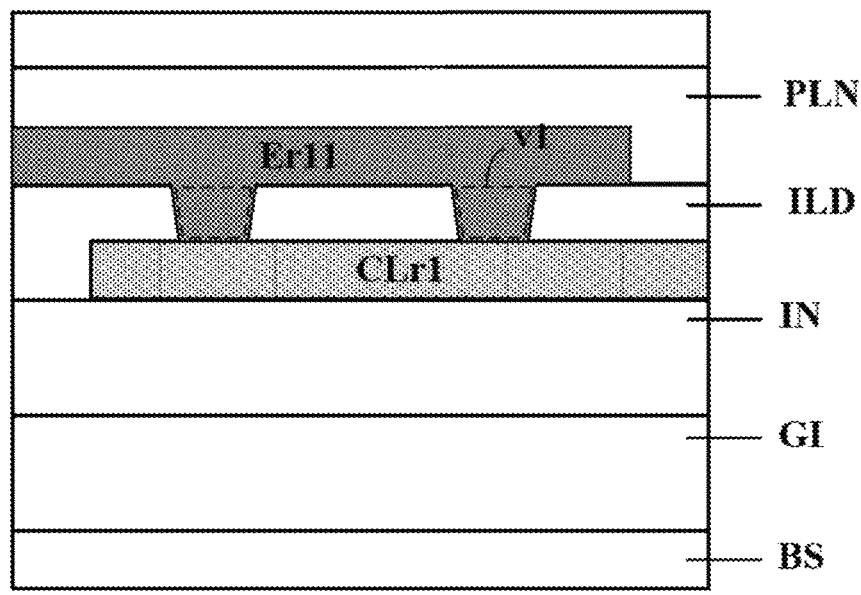
FIG. 3A is a cross-sectional view along an A-A' line in FIG. 2A.

FIG. 3A is a cross-sectional view along an A-A' line in FIG. 2A. Referring to FIG. 2A and FIG. 3A, the testing circuit in some embodiments includes a base substrate BS, a gate insulating layer GI on the base substrate BS, an insulating layer IN on the gate insulating layer GI, an inter-layer dielectric layer ILD on the insulating layer IN, and a planarization layer PLN on the inter-layer dielectric layer ILD. The gate insulating layer GI is between the semiconductor material layer and the first conductive layer. The insulating layer IN is between the first conductive layer and the second conductive layer. The inter-layer dielectric layer ILD is between the second conductive layer and the first signal line layer. The planarization layer is between the first signal line layer and the second signal line layer. Referring to FIG. 2A, FIG. 2D, FIG. 2E, and FIG. 3A, in some embodiments, a respective first electrode Er11 of a respective first switching transistor Swr1 is connected to a respective first connecting line CLr1 though a via (e.g., v1 in FIG. 3A) extending through the inter-layer dielectric layer ILD.

Figure 3B:
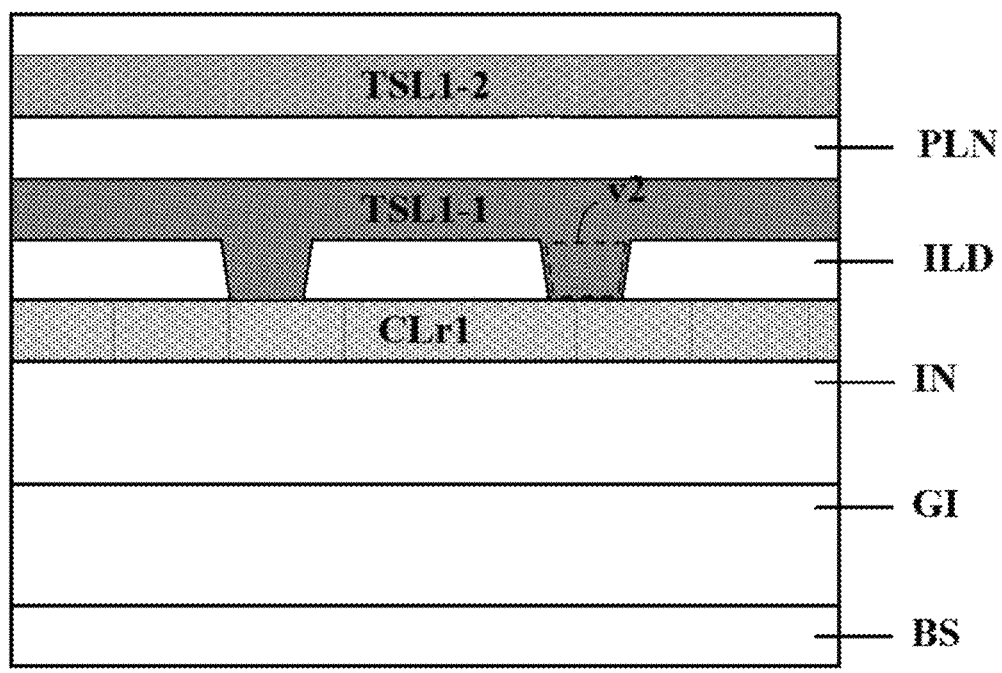
FIG. 3B is a cross-sectional view along a B-B' Yule in FIG. 2A.

FIG. 3B is a cross-sectional view along a B-B' line in FIG. 2A. Referring to FIG. 2A, FIG. 2D, FIG. 2E, and FIG. 3B, in some embodiments, a respective first sub-layer TSL1-1 of a respective testing signal line is connected to corresponding first connecting lines (e.g., CLr1 in FIG. 3B) respective though vias (e.g., v2 in FIG. 3B) extending, through the inter-layer dielectric layer ILD.

Figure 3C:
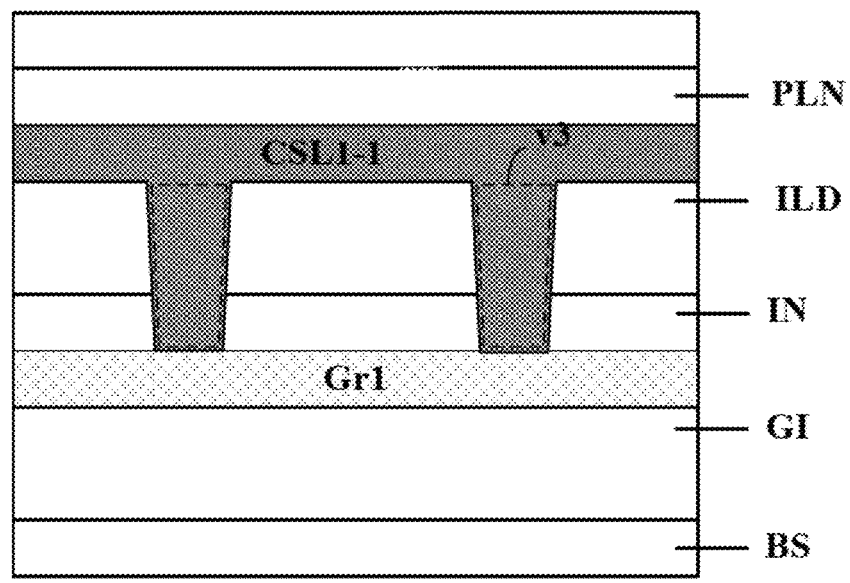
FIG. 3C is a cross-sectional view along a C-C' line in FIG. 2A.

FIG. 3C is a cross-sectional view along a. C-C' line in FIG. 2A. Referring to FIG. 2A, FIG. 2C, FIG. 2E, and FIG.

3C, in some embodiments, a respective first control signal line (e.g., CSL1-1 in FIG. 3C) is connected to corresponding gate electrodes (e.g., Gr1 in FIG. 3C) of corresponding first switching transistors respectively through vias (e.g., v3 in FIG. 3C) extending through the inter-layer dielectric layer ILD and the insulating layer IN.

Figure 3D:
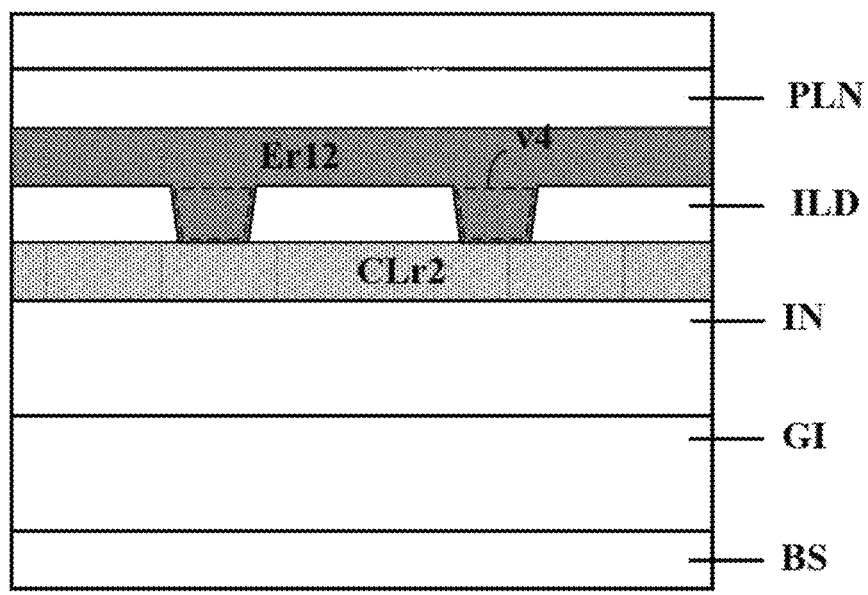
FIG. 3D is a cross-sectional view along a D-D' line in FIG. 2A.

FIG. 3D is a cross-sectional view along a D-D' line in FIG. 2A. Referring to FIG. 2A. FIG. 2D, FIG. 2E, and FIG. 3D, in some embodiments, a respective second electrode (e.g., Er12 in FIG. 3D) of a respective first switching transistor is connected to a respective second connecting line (e.g., CLr2 in FIG. 3D) CLr2 through a via e.g., v4 in FIG. 3D) extending through the inter-layer dielectric layer ILD.

Figure 3E:
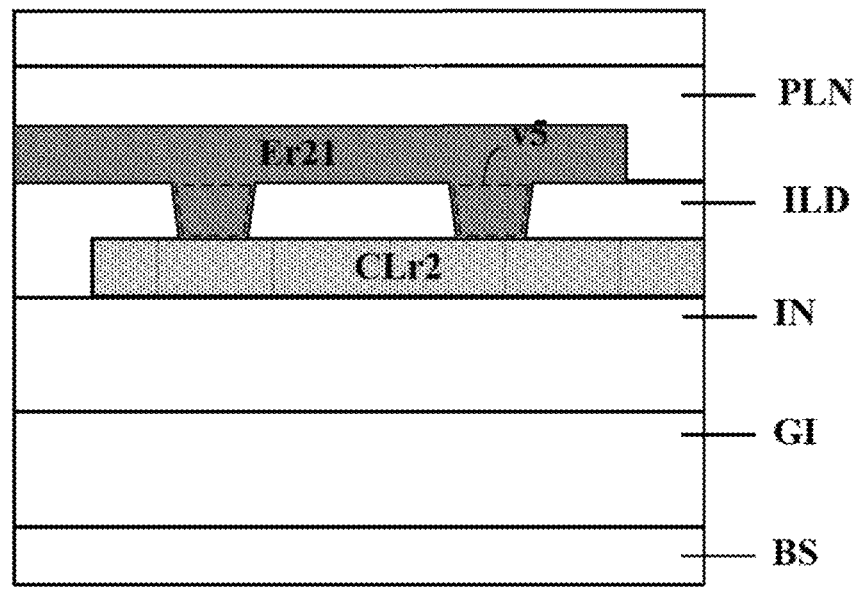
FIG. 3E is a cross-sectional view along a E-E' line in FIG. 2A.

FIG. 3E is a cross-sectional view along a E-E' line in FIG. 2A. Referring to FIG. 2A, FIG. 2D, FIG. 2E, and FIG. 3E, in some embodiments, a respective first electrode (e.g., Er21 in FIG. 3E) of a respective second switching transistor is connected to the respective second connecting line (e.g., CLr2 in FIG. 3E) through a via (e.g., v5 in FIG. 3E) extending through the inter-layer dielectric layer ILD.

Figure 3F:
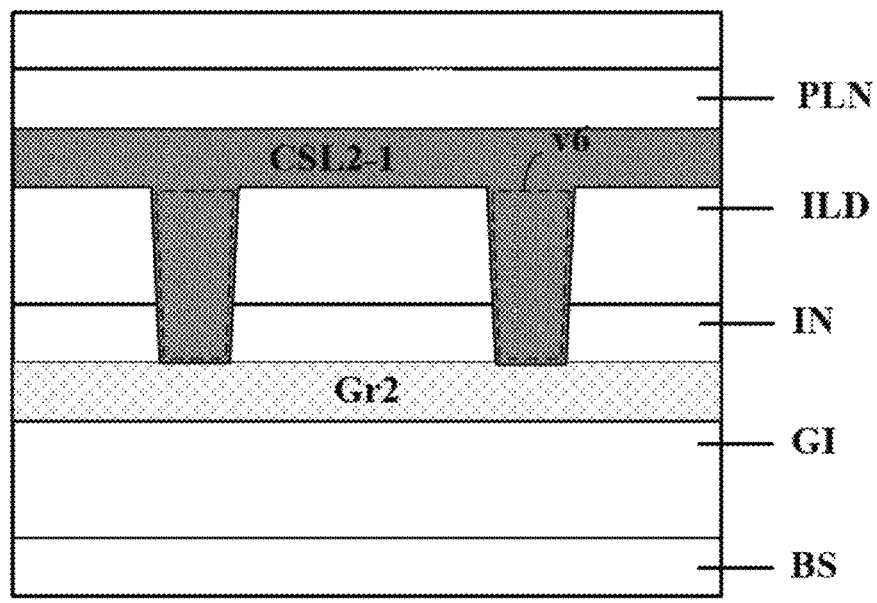
FIG. 3F is a cross-sectional view along an F-F' line in FIG. 2A.

FIG. 3F is a cross-sectional view along an F-F' line in FIG. 2A. Referring to FIG. 2A, FIG. 2C, FIG. 2E, and FIG. 3F, in some embodiments, a respective second control signal line (e.g., CSL2-1 in FIG. 3F) is connected to corresponding gate electrodes (e.g., Gr2 in FIG. 3F) of corresponding second switching transistors respectively through vias (e.g., v6 in FIG. 3F) extending through the inter-layer dielectric layer ILD and the insulating layer IN.

Figure 3G:
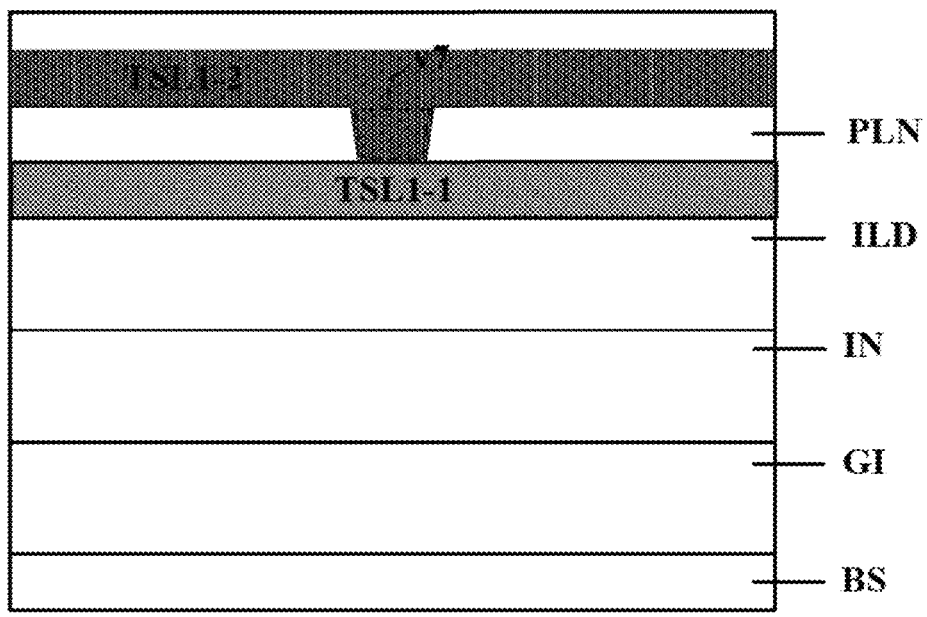
FIG. 3G is a cross-sectional view along a G-G' line in FIG. 2A.

FIG. 3G is a cross-sectional view along a G-G' line in FIG. 2A. Referring to FIG. 2A, FIG. 2E, FIG. 2F, and FIG. 3G, in some embodiments, a respective second sub-layer (e.g., TSL1-2 in FIG. 3G) of a respective testing signal line is connected to a respective first sub-layer (e.g., TSL1-1 in FIG. 3G) of the respective testing signal line through a via (e.g., v7 in FIG. 3G) extending through the planarization layer PLN.

Figure 3H:
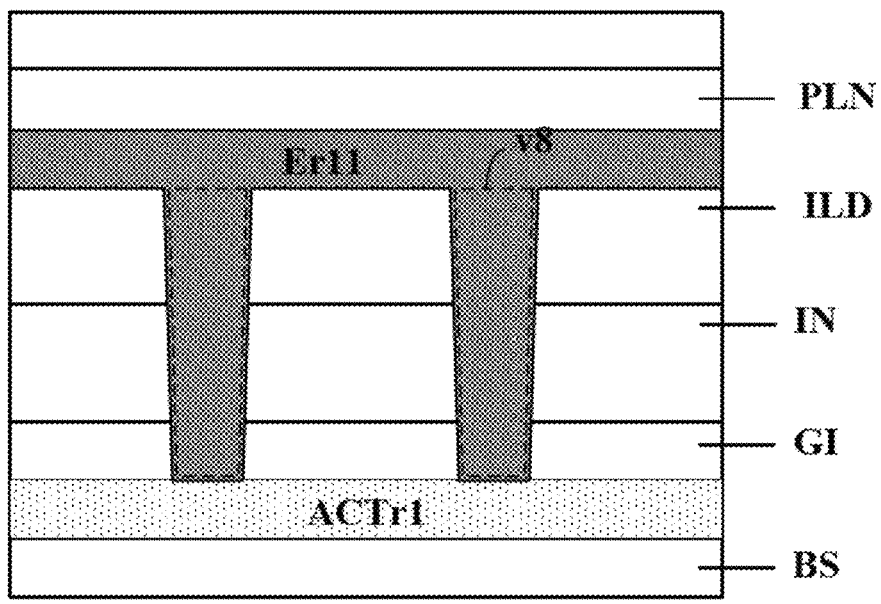
FIG. 3H is a cross-sectional view along an H-H' line in FIG. 2A.

FIG. 3H is a cross-sectional view along an H-H' line in FIG. 2A. Referring to FIG. 2A, FIG. 2B, FIG. 2E, and FIG. 3H, in some embodiments, a respective first electrode (e.g., Er11 in FIG. 3H) of a respective first switching transistor is connected to a respective active layer (e.g., ACTr1 in FIG. 3H) of the respective first switching transistor through a via (e.g., v8 in FIG. 3H) extending through the inter-layer dielectric layer ILD, the insulating layer IN, and the gate insulating layer GI.

Figure 3I:
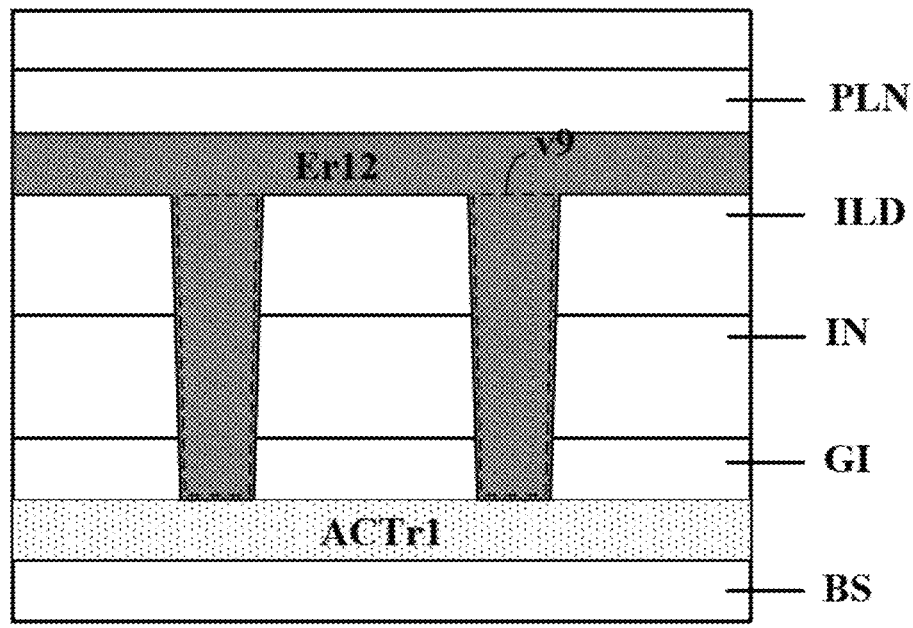
FIG. 3I is a cross-sectional view along an I-I' line in FIG. 2A.

FIG. 3I is a cross-sectional view along an I-I' line in FIG. 2A. Referring to FIG. 2A, FIG. 2B, FIG. 2E, and FIG. 3I, in some embodiments, a respective second electrode (e.g., Er12 in FIG. 3I) of a respective first switching transistor is connected to a respective active layer (e.g., ACTr1 in FIG. 3I) of the respective first switching transistor through a via (e.g., v9 in FIG. 3I) extending through the inter-layer dielectric layer ILD, the insulating layer IN, and the gate insulating layer GI.

Figure 3J:
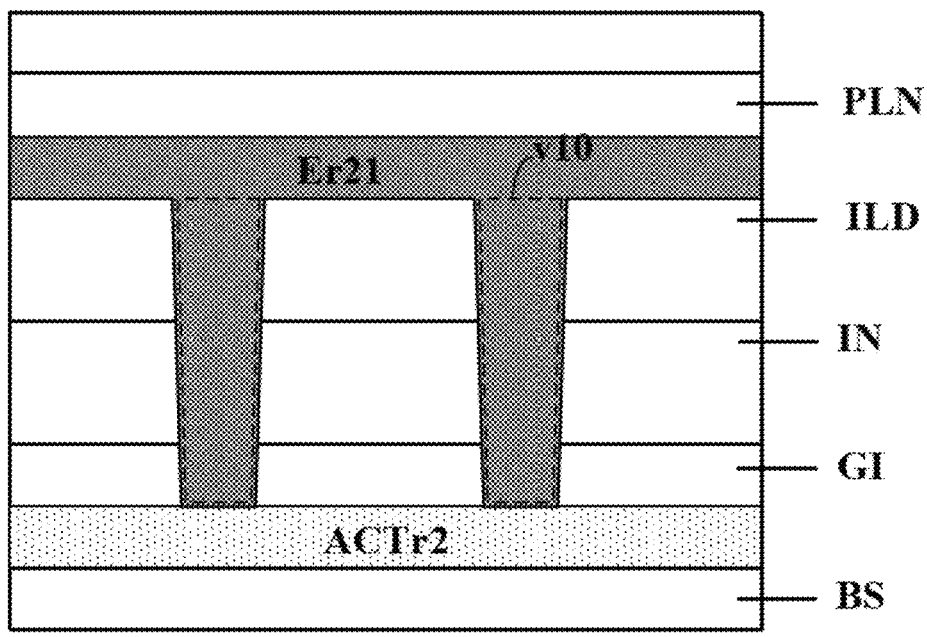
FIG. 3J is a cross-sectional view along a J-J' line in FIG. 2A.

FIG. 3J is a cross-sectional view along a line in FIG. 2A. Referring to FIG. 2A, FIG. 2B. FIG. 2E, and FIG. 3J, in some embodiments, a respective first electrode (e.g., Er21 in FIG. 3J) of a respective second switching transistor is connected to a respective active layer (e.g., ACTr2 in FIG. 3J) of the respective second switching transistor through a via (e.g., v10 in FIG. 3J) extending through the inter-layer dielectric layer ILD, the insulating layer IN, and the gate insulating layer GI.

Figure 3K:
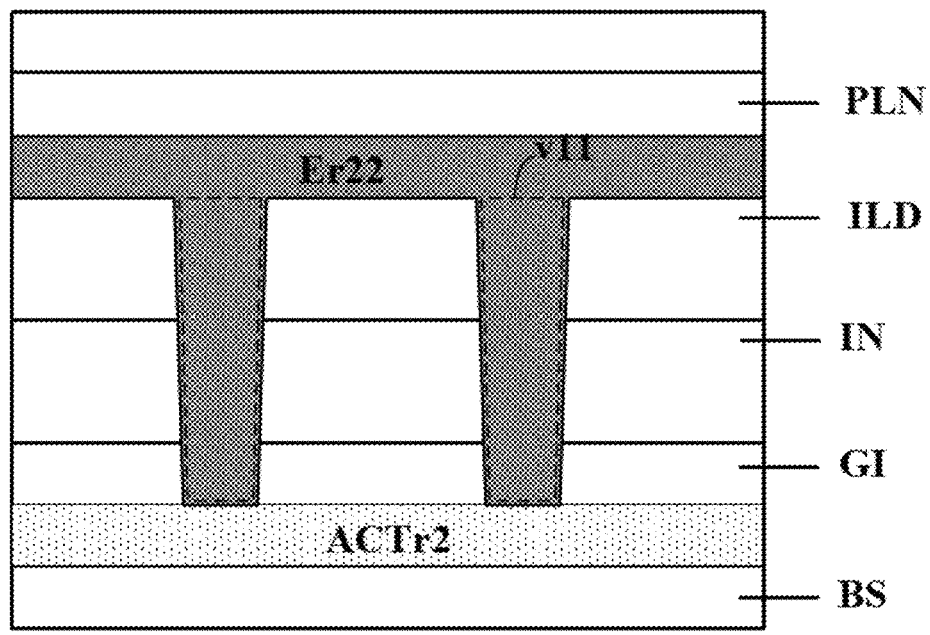
FIG. 3K is a cross-sectional view along a K-K' line in FIG. 2A.

FIG. 3K is a cross-sectional view along a K-K' line in FIG. 2A. Referring to FIG. 2A, FIG. 2B, FIG. 2E, and FIG. 3K, in some embodiments, a respective second electrode (e.g., Er22 in FIG. 3K) of a respective second switching transistor is connected to the respective active layer (e.g., ACTr2 in FIG. 3K) of the respective second switching transistor through a via (e.g., v11 in FIG. 3K) extending through the inter-layer dielectric layer ILD, the insulating layer IN, and the gate insulating layer GI.

Figure 4A:
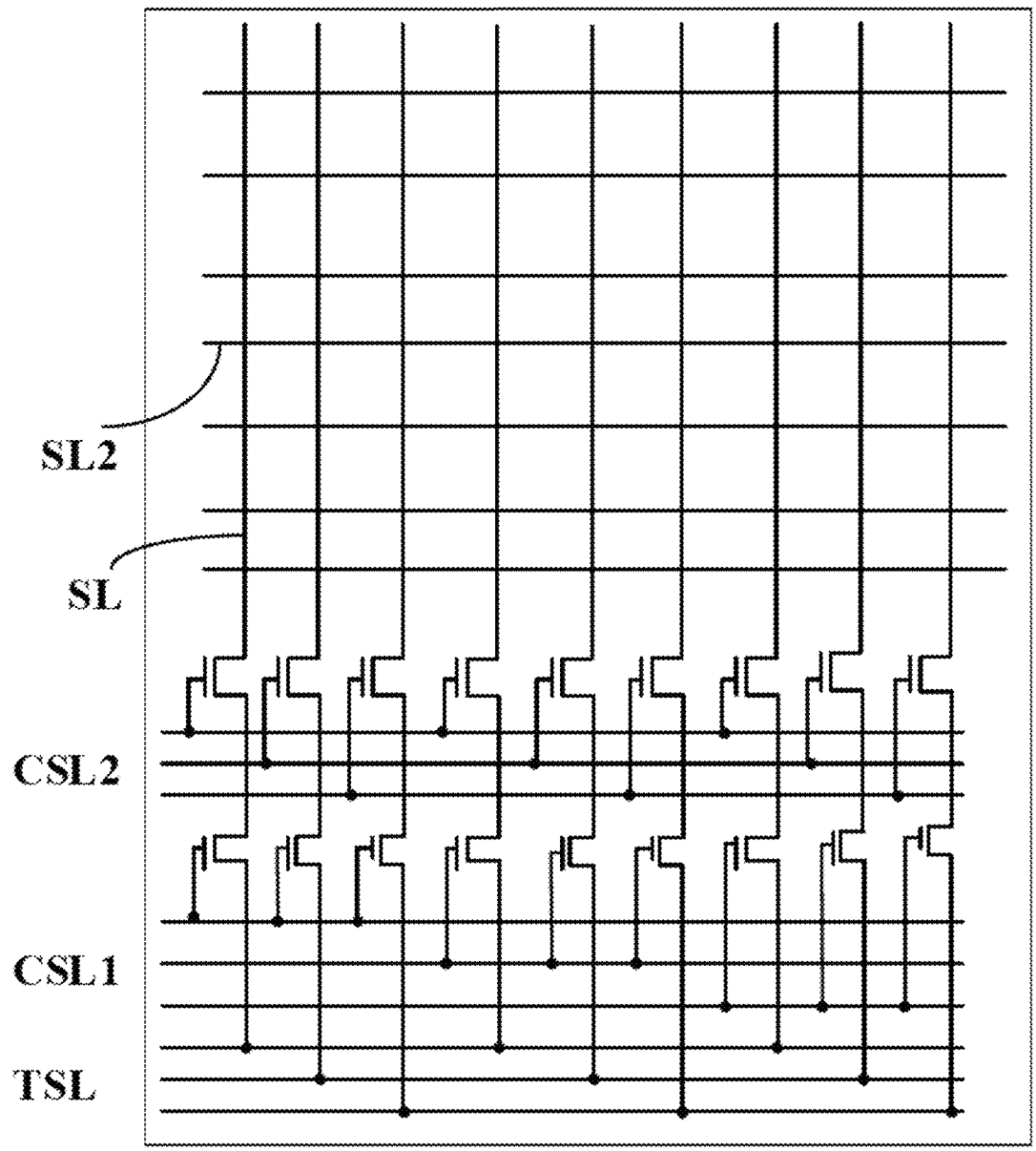
FIG. 4A is a schematic diagram of the structure of a display panel in some embodiments according to the present disclosure.

In another aspect, the present disclosure further provides a display panel. FIG. 4A is a schematic diagram of the structure of a display panel in some embodiments according to the present disclosure. Referring to FIG. 4, the display panel in some embodiments includes the testing circuit described herein or fabricated by a method described herein, and M number of array substrate signal lines SL respectively connected to second electrodes of the M number of second switching transistors. Optionally, the M number of array substrate signal lines are M number of data lines. In some embodiments, the display panel further includes a plurality of second array substrate signal lines SL2. Optionally, the plurality of second array substrate signal lines SL2 are a plurality of gate lines.

Figure 4B:
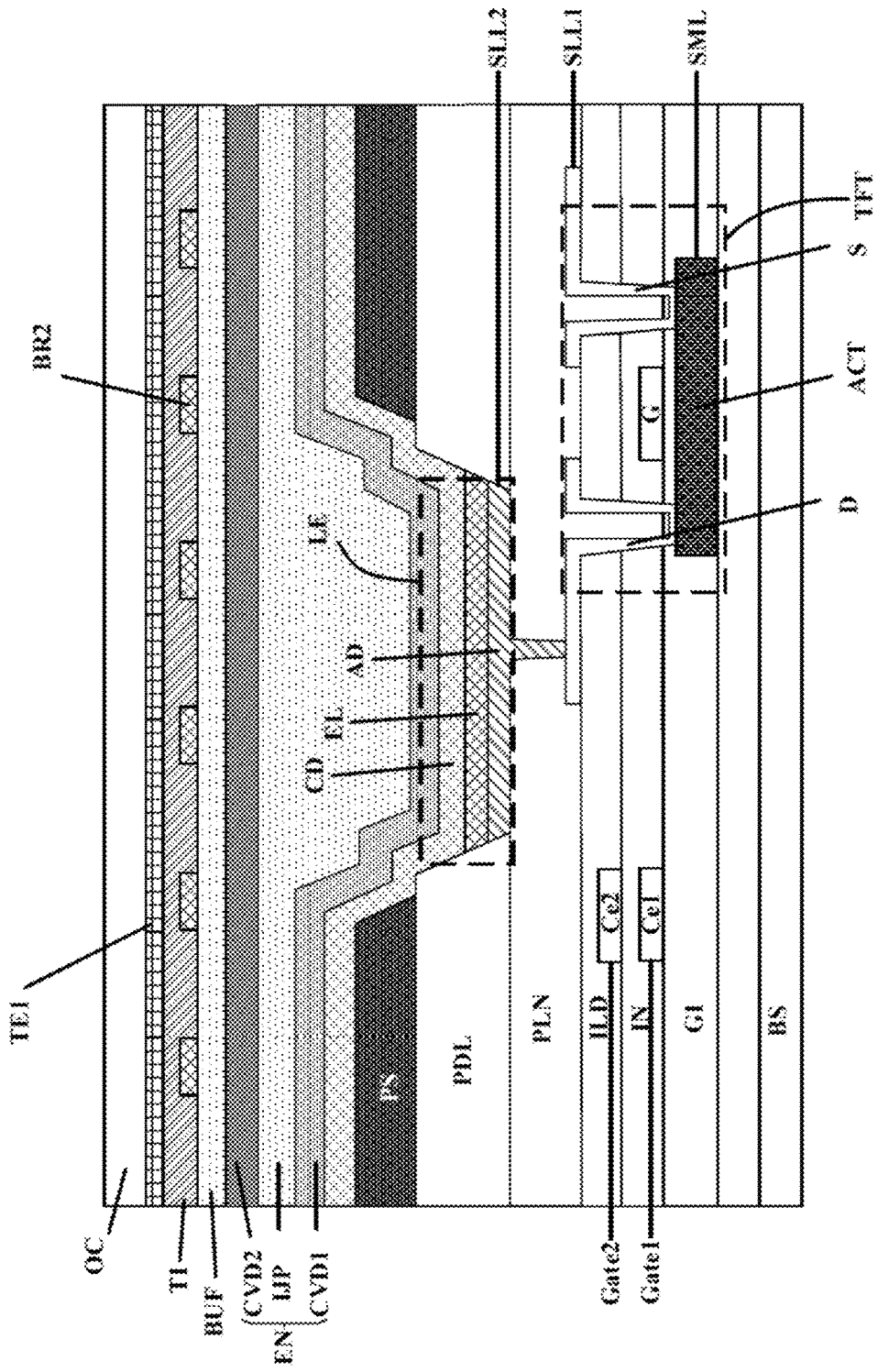
FIG. 4B illustrates a detailed structure in a display region in a display panel in some embodiments according to the present disclosure.

Various implementations of the present display panel may be practiced. FIG. 4B illustrates a detailed structure in a display region in a display panel in some embodiments according to the present disclosure. Referring to FIG. 4B, the display panel in the display region in some embodiments includes a base substrate BS (e.g., a flexible base substrate); an active layer ACT of a respective one of a plurality of thin film transistors ITT on the base substrate BS; a gate insulating layer GI on a side of the active layer ACT away from the base substrate BS; a gate electrode G and a first capacitor electrode Ce1 (both are parts of a first gate metal layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second gate metal layer) in a side of the insulating layer IN away from the gate insulating layer GI; an inter-layer dielectric layer ILD on a side of the second capacitor electrode Ce2 away from the gate insulating layer GI; a source electrode S and a drain electrode D (parts of a first SD metal layer) on a side of the inter-layer dielectric layer ILD away from the gate insulating layer GI; a planarization layer PLN on a side of the source electrode S and the drain electrode D away from the inter-layer dielectric layer ILD; a pixel definition layer PDL defining a subpixel aperture and on a side of the planarization layer PLN away from the base substrate BS; and a light emitting element LE in the subpixel aperture. The light emitting element LE includes an anode AD on a side of the planarization layer PLN away from the inter-layer dielectric layer ILD; a light emitting layer EL on a side of the anode AD away from the planarization layer PLN; and a cathode layer CD on a side of the light emitting layer EL away from the anode AD. The display panel in the display region further includes an encapsulating layer EN encapsulating the dummy light emitting element DLE, and on a side of the cathode layer CD away from the base substrate BS. The encapsulating, layer EN in some embodiments includes a first inorganic encapsulating sub layer CVD1 on a side of the cathode layer CD away from the base substrate BS, an organic encapsulating sub-layer HP on a side of the first inorganic encapsulating sub-layer CVD1 away from the base substrate BS, and a second inorganic encapsulating sub-layer CVD2 on a side of the organic encapsulating sub-layer IJP away from the first inorganic encapsulating sub-layer CVD1. The display panel in the display region further includes a buffer layer BLT on a side of the encapsulating layer EN away from the base substrate BS; a plurality of second electrode bridges BR2 on a side of the buffer layer BUF away from the encapsulating layer EN; a touch insulating layer TI on a side of the plurality of second electrode bridges BR2 away from the buffer layer BUF; a plurality of first touch electrodes TE1 on a side of the touch insulating layer TI away from the buffer layer BUF; and an overcoat layer OC on a side of the plurality of first touch electrodes TE1 away from the touch insulating layer TI.

Figure 4C:
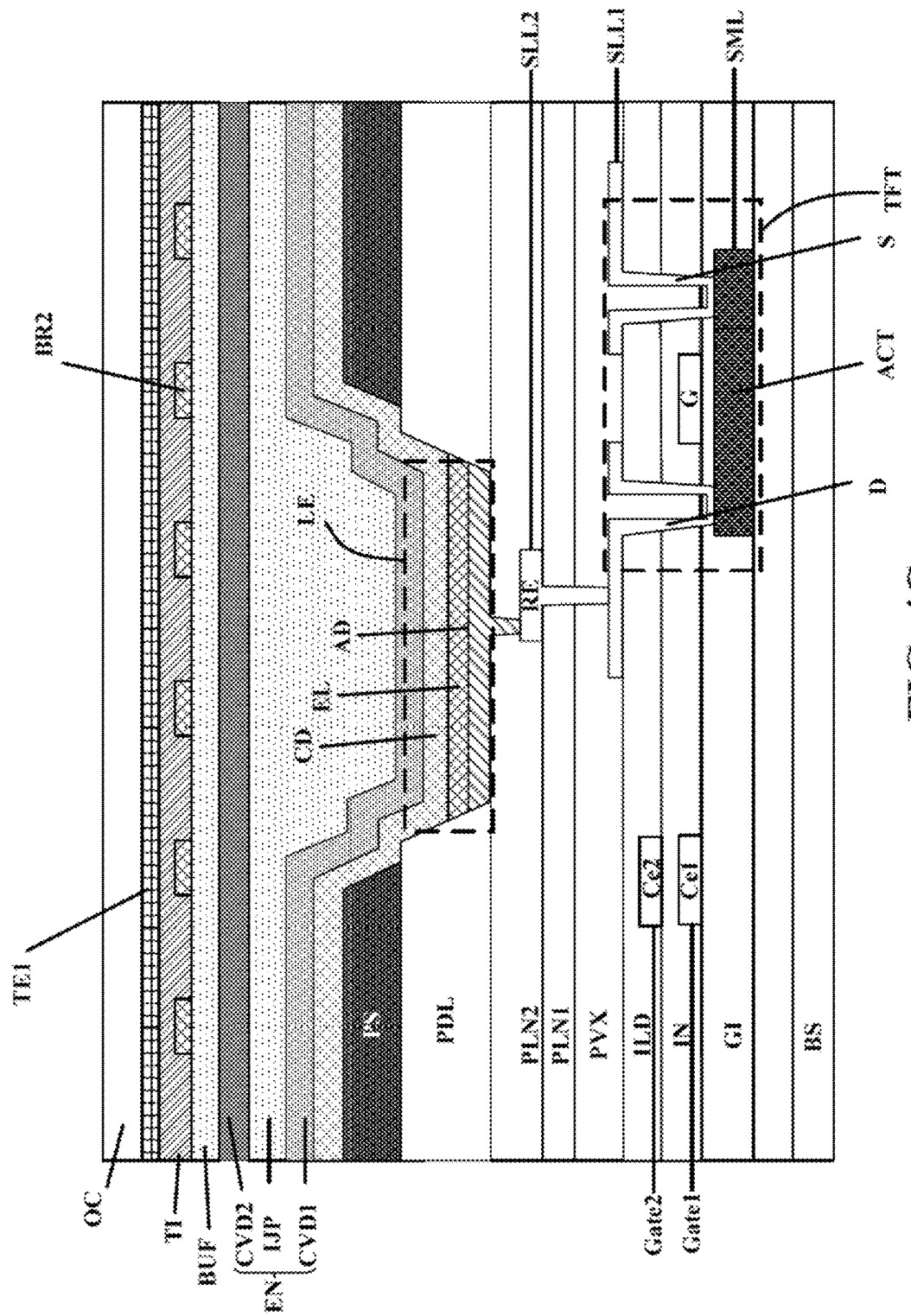
FIG. 4C illustrates a detailed structure in a display region in a display panel in some embodiments according to the present disclosure.

FIG. 4C illustrates a detailed structure in a display region in a display panel in some embodiments according to the present disclosure. Referring to FIG. 4C, the display panel in the display region in some embodiments includes a base substrate BS (e.g., a flexible base substrate); an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first gate metal layer) on a side of the gate insulating, layer GI away from the base substrate BS; an insulating layer IN on a side of the gate electrode G and the first capacitor electrode Ce1 away from the gate insulating layer GI; a second capacitor electrode Ce2 (a part of a second gate metal layer) on a side of the insulating layer IN away from the gate insulating layer GI; an inter-layer dielectric layer ILD on a side of the second capacitor electrode Ce1 away from the gate insulating layer GI; a source electrode S and a drain electrode D (parts of a first SD metal layer) on a side of the inter-layer dielectric layer ILD away from the gate insulating layer GI; a passivation layer PVX on a side of the source electrode S and the drain electrode. D away from the inter-layer dielectric layer ILD; a first planarization layer PLN1 on a side of the passivation layer PVX away from the inter-layer dielectric layer ILD; a second planarization layer PLN2 on side of the first planarization layer PLN1 away from the passivation layer PVX; a relay electrode RE (part of a second SD metal layer) on a side of the second planarization layer PLN2 away from the first planarization layer PLN1; a pixel definition layer PDL defining a subpixel aperture and on a side of the second planarization layer PLN2 away from the base substrate BS; and a light emitting element LE in the subpixel aperture. The light emitting element LE includes an anode AD on a side of the second planarization layer PLN2 away from the first planarization layer PLN1; a light emitting layer EL on a side of the anode AD away from the second planarization layer PLN2; and a cathode layer CD on a side of the light emitting layer EL away from the anode AD. The display panel in the display region further includes an encapsulating layer EN encapsulating the dummy light emitting element DLE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer IJP on a side of the first inorganic encapsulating sub-layer CVD1 away from the base substrate BS, and a second inorganic encapsulating sub-layer CVD2 on a side of the organic encapsulating sub-layer IJP away from the first inorganic encapsulating sub-layer CVD1. The display panel in the display region further includes a buffer layer BUF on a side of the encapsulating layer EN away from the base substrate BS; a plurality of second electrode bridges BR2 on a side of the buffer layer BUF away from the encapsulating layer EN; a touch insulating layer TI on a side of the plurality of second electrode bridges BR2 away from the buffer layer BUF; a plurality of first touch electrodes TE1 on a side of the touch insulating layer TI away from the buffer layer BUF; and an overcoat layer OC on a side of the plurality of first touch electrodes TE1 away from the touch insulating layer TI. Optionally, the display panel in the display region does not include the passivation layer PVX e.g., the inter-layer dielectric layer ILD is in direct contact with the first planarization layer PLN1.

In FIG. 4B and FIG. 4C, various layers corresponding to the layers in FIG. 2B to FIG. 2F are denoted. For example, the display panel includes a semiconductor material layer SML (corresponding to FIG. 2B), a first conductive layer Gate1 (corresponding to FIG. 2C), a second conductive layer Gate2 (corresponding to FIG. 2D), a first signal line layer SLL1 (corresponding to FIG. 2E), and a second signal line layer SLL2 (corresponding to FIG. 2F).

Figure 4D:
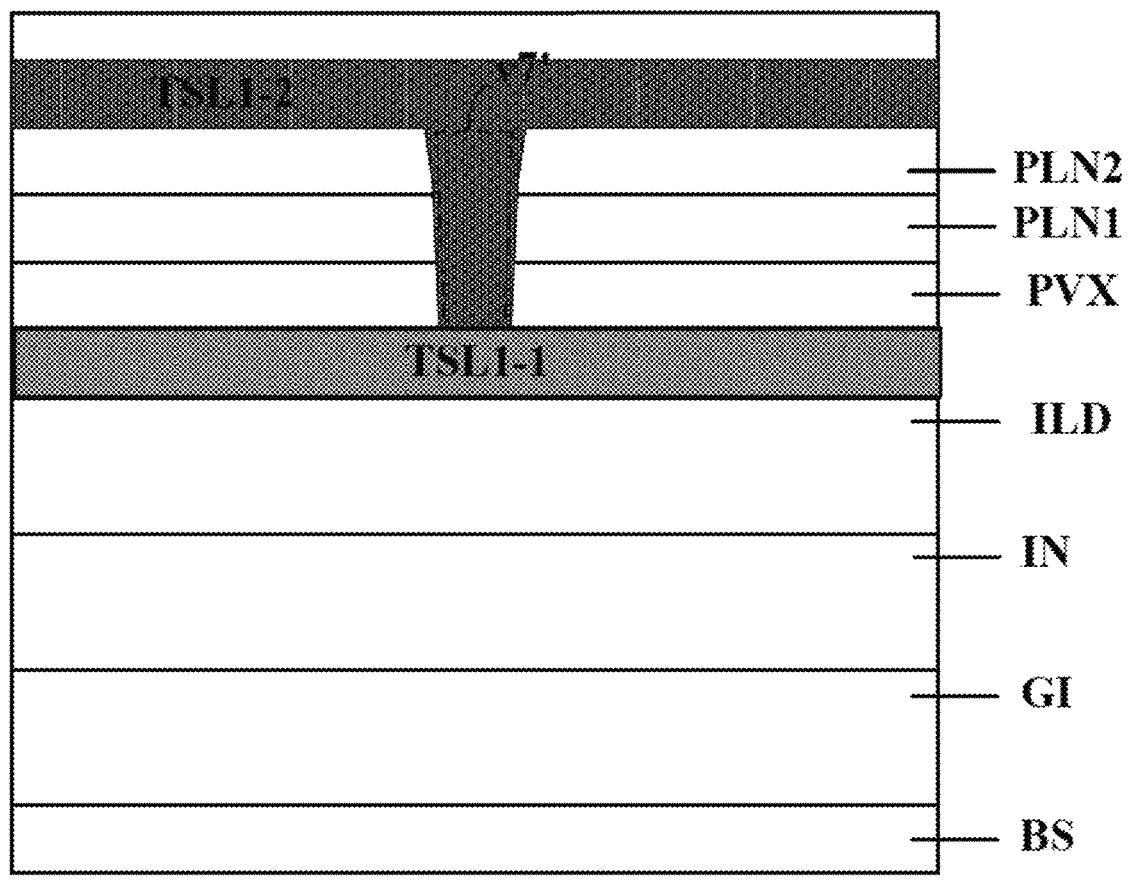
FIG. 4D is a cross-sectional view along a G-G' line in a testing circuit in some embodiments according to the present disclosure.

The embodiment depicted in FIG. 4C includes at least one additional layer such as a passivation layer PVX, as compared to the embodiment depicted in FIG. 4B. FIG. 3A to FIG. 3K described an embodiment without the passivation layer PVX. However, the present disclosure may be implemented in various display panels of different types. FIG. 4D is a cross-sectional view of a testing circuit in some embodiments according to the present disclosure. FIG. 4D corresponds to FIG. 3G except that the display panel includes additional layers. Referring to FIG. 4D, in some embodiments, a respective second sub-layer TSL1-2 in FIG. 4D of a respective testing signal line is connected to a respective first sub-layer (e.g., TSL1-1 in FIG. 4D) of the respective testing signal line through a via (e.g., v7' in FIG. 4D) extending through the second planarization layer PLN2, the first planarization layer PLN1, and the passivation layer PVX.

In another aspect, the present disclosure further provides a method of testing an array substrate. In some embodiments, the method includes providing a testing circuit comprising N number of testing signal lines, N being an integer greater than 1; N number of first control signal lines; N number of second control signal lines; M number of first switching transistors, M being an integer greater than N; and M number of second switching transistors; connecting a second electrode of a m-th first switching transistor to a first electrode of a m-th second switching transistor, $1 \leq m \leq M$; connecting a n-th testing signal line to first electrodes of (kN+n)-th first switching transistors, $1 \leq n \leq N$, $0 \leq k < M/N$; connecting a n-th first control signal line to gate electrodes of $(kN^2+((n-1)+1))$-th to $(kN^2+n*N)$-th first switching transistors, $0 \leq k < M/N$; connecting a n-th second control signal line to gate electrodes of the (kN+n)-th second switching transistors; and connecting a second electrode of the m-th second switching transistor to a m-th array substrate signal line.

In some embodiments. N is a total number of different colors of subpixels in an array substrate comprising M number of array substrate signal lines respectively connected to second electrodes of the M number of second switching transistors. In one example, the array substrate includes a red subpixel, a green subpixel, and a blue subpixel, and N=3. In another example, the array substrate includes a red subpixel, a green subpixel, a blue subpixel, and a white subpixel, and N=4.

In one example, N=2. In another example, N=3. In another example, N=another example, N=5. In another example, N=6.

In some embodiments, the testing is performed in a cycle including N number of period. In a n-th period, the method includes providing a turning-on voltage signal to the n-th first control signal line while providing timing-off voltage signals to first control signal lines other than the n-th first control signal hue, providing turning-on voltage signals respectively to the N number of second control signal lines, and providing testing voltage signals respectively to the N number of testing signal lines, thereby providing the testing voltage signals respectively to array substrate signal lines respectively connected to second electrodes of $(kN^2+((n-1)*N)+1)$-th to $(kN^2+n*N)$-th second switching transistors.

In one example, N=3; and the cycle includes a first period, a second period, and a third period. FIG. 5 is a timing diagram of operating a testing circuit in some embodiments according to the present disclosure.

Referring to FIG. 1B and FIG. 5, in the first period, the method includes providing a turning-on voltage signal. ON to a first-first control signal line CSL1-1 while providing turning-off voltage signals OFF to a second-first control signal line CSL1-2 and a third-fast control signal line CSL1-3, providing turning-on voltage signals respectively to a first-second control signal line CSL2-1, a second-second control signal line CSL2-2, and a third-second control signal line CSL2-3, and providing testing voltage signals respectively to a first testing signal line TSL1, a second testing signal line TSL2, and a third testing signal lines TSL3, thereby providing the testing voltage signals respectively to array substrate signal lines respectively connected to second electrodes of a fast-second switching transistor SW2-1, a second-second switching transistor SW2-2, and a third-second switching transistor SW2-3.

Referring to FIG. 1B and FIG. 5, in the second period, the method includes providing a turning-on voltage signal ON to the second-first control signal line CSL1-2 while providing turning-off voltage signals OFF to the first-fast control signal line CSL1-1 and the third-first control signal line CSL1-3, providing turning-on voltage signals respectively to a first-second control signal line CSL2-1, a second-second control signal line CSL2-2, and a third-second control signal line CSL2-3, and providing testing voltage signals respectively to a first testing signal line TSL1, a second testing signal line TSL2, and a third testing signal line TSL3, thereby providing the testing voltage signals respectively to array substrate signal lines respectively connected to second electrodes of a fourth-second switching transistor SW2-4, a fifth-second switching transistor SW2-5, and a sixth-second switching transistor SW2-6.

Referring to FIG. 1B and FIG. 5, in the third period, the method includes providing a turning-on voltage signal ON to the third-first control signal line CSL1-3 while providing turning-off voltage signals OFF to the first-first control signal line CSL1-1 and the second-first control signal line CSL1-2, providing turning-on voltage signals respectively to a first-second control signal line CSL2-1, a second-second control signal line CSL2-2, and a third-second control signal line CSL2-3, and providing testing voltage signals respectively to a first testing signal line TSL1, a second testing signal line TSL2, and a third testing signal line TSL3, thereby providing the testing voltage signals respectively to array substrate signal lines respectively connected to second electrodes of a seventh-second switching transistor SW2-7, an eighth-second switching transistor SW2-8, and a ninth-second switching transistor SW2-9.

In some embodiments, the testing is performed in a cycle including N number of period, a respective period including N number of sub-period. In some embodiments, the method includes, in a n-th period, providing a turning-on voltage signal to the n-th second control signal line while providing taming-off voltage signals to second control signal lines other than the n-th second control signal line, providing testing voltage signals respectively to the N number of testing signal lines. Optionally, in a n-th sub-period of the n-th period, providing a turning-on voltage signal to the n-th first control signal line while providing turning-off voltage signals to first control signal lines other than the n-th first control signal line, thereby providing the testing voltage signals respectively to array substrate signal lines connected to second electrodes of $(kN^2+((n-1)*N)+n)$-th second switching transistors.

In some embodiments, the cycle includes a first period, a second period, and a third period. Optionally, the first period comprises a first-first sub-period, a second-first sub-period, and a third-first sub-period. Optionally, the second period comprises a first-second sub-period, a second-second sub-period, and a third-second sub-period. Optionally, the third period comprises a first-third sub-period, a second-third sub-period, and a third-third sub-period.

In some embodiments, in the first period, the method comprises providing a turning-on voltage signal to a first-second control signal line while providing turning-off voltage signals to a second-second control signal line and a third-second control signal line, providing testing voltage signals respectively to a first testing signal hue, a second testing signal hue, and a third testing signal line. Optionally, in the first-first sub-period, the method comprises providing a turning-on voltage signal to a first-first control signal line while providing aiming-off voltage signals to a second-first control signal line and a third-first control signal line, thereby providing the testing voltage signals respectively to array substrate signal lines connected to a second electrode of a first-second switching transistor. Optionally, in the second-first sub-period, the method comprises providing a turning-on voltage signal to the second-first control signal line while providing turning-off voltage signals to the first-first control signal line and the third-first control signal line, thereby providing the testing voltage signals respectively to array substrate signal lines connected to a second electrode of a fourth-second switching transistor. Optionally, in the third-first sub-period, the method comprises providing a turning-on voltage signal to the third-first control signal line while providing turning-off voltage signals to the first-first control signal line and the second-first control signal line, thereby providing the testing voltage signals respectively to array substrate signal lines connected to a second electrode of a seventh-second switching transistor.

In some embodiments, in the second period, the method comprises providing a turning-on voltage signal to the second-second control signal line while providing turning-off voltage signals to the first-second control signal line and the third-second control signal line, providing testing voltage signals respectively to the first testing signal line, the second testing signal line, and the third testing signal line. Optionally, in the first-second sub-period, the method comprises providing a turning-on voltage signal to the first-first control signal line while providing turning-off voltage signals to the second-first control signal line and the third-first control signal line, thereby providing the testing voltage signals respectively to array substrate signal lines connected to a second electrode of a second-second switching transistor. Optionally, in the second-second sub-period, the method comprises providing a turning-on voltage signal to the second-first control signal line while providing turning-off voltage signals to the first-first control signal line and the third-first control signal line, thereby providing the testing voltage signals respectively to array substrate signal lines connected to a second electrode of a fifth-second switching transistor. Optionally, in the third-second sub-period, the method comprises providing a turning-on voltage signal to the third-first control signal line while providing turning-off voltage signals to the first-first control signal line and the second-first control signal line, thereby providing the testing voltage signals respectively to array substrate signal lines connected to a second electrode of an eighth-second switching transistor.

In some embodiments, in the third period, the method comprises providing a turning-on voltage signal to the third-second control signal line while providing turning-off voltage signals to the first-second control signal line and the second-second control signal providing testing voltage signals respectively to the first testing signal line, the second testing signal line, and the third testing signal line. Optionally, in the first-third sub-period, the method comprises providing a turning-on voltage signal to the first-first control signal line while providing turning-off voltage signals to the second-first control signal line and the third-first control signal line, thereby providing the testing voltage signals respectively to array substrate signal lines connected to a second electrode of a third-second switching transistor. Optionally, in the second-third sub-period, the method comprises providing a turning-on voltage signal to the second-first control signal line while providing turning-off voltage signals to the first-first control signal line and the third-first control signal line, thereby providing the testing voltage signals respectively to array substrate signal lines connected to a second electrode of a sixth-second switching transistor. Optionally, in the third-third sub-period, the method comprises providing a turning-on voltage signal to the third-first control signal line while providing turning-off voltage signals to the first-first control signal line and the second-first control signal line, thereby providing the testing voltage signals respectively to array substrate signal lines connected to a second electrode of a ninth-second switching transistor.

The present method of testing the array substrate in some embodiments may be implemented in an aging process of the array substrate having OLED devices. In the aging process, a large stress is applied to the array substrate, particularly when a large current is required for testing a high-resolution array substrate. The large current often times results in circuit burns or circuit non-responsiveness. The present testing circuit and the method of testing the array substrate greatly improves the flexibility in testing the array substrate, effectively avoids circuit burns or circuit non-responsiveness when a large current is used during the testing.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the fallowing claims.

What is claimed is:

1. An array substrate, comprising:
   N number of testing signal lines, N being an integer greater than 1;
   N number of first control signal lines;
   N number of second control signal lines;
   M number of first switching transistors, M being an integer greater than N; and
   M number of second switching transistors;
   wherein a second electrode of a m-th first switching transistor is connected to a first electrode of a m-th second switching transistor, $1 \leq m \leq M$;
   a n-th testing signal line is connected to first electrodes of (kN+n)-th first switching transistors, $1 \leq n \leq N$, $0 \leq k < M/N$;
   a n-th first control signal line is connected to gate electrodes of $(kN^2+((n-1)*N)+1)$-th to $(kN^2+n*N)$-th first switching transistors, $0 \leq k < M/N$;
   a n-th second control signal line is connected to gate electrodes of the (kN+n)-th second switching transistors; and
   a second electrode of the m-th second switching transistor is connected to a m-th array substrate signal line.

2. The array substrate of claim 1, wherein M is an integer multiple of N.

3. The array substrate of claim 1, wherein N is a total number of different colors of subpixels in an array substrate comprising M number of array substrate signal lines respectively connected to second electrodes of the M number of second switching transistors.

4. The array substrate of claim 1, wherein N=3.

5. The array substrate of claim 4, comprising:
   a first-first control signal line, a second-first control signal line, and a third-first control signal line;
   a first-second control signal line, a second-second control signal line, and a third-second control signal line;
   a first testing signal line, a second testing signal line, and a third testing signal line;
   a first-first switching transistor, a second-first switching transistor, a third-first switching transistor, a fourth-first switching transistor, a fifth-first switching transistor, a sixth-first switching transistor, a seventh-first switching transistor, an eighth-first switching transistor, and a ninth-first switching transistor; and
   a first-second switching transistor, a second-second switching transistor, a third-second switching transistor, a fourth-second switching transistor, a fifth-second switching transistor, a sixth-second switching transistor, a seventh-second switching transistor, an eighth-second switching transistor, and a ninth-second switching transistor;

wherein the first testing signal line is connected to first electrodes of the first-first switching transistor, the fourth-first switching transistor, and the seventh-first switching transistor;

the second testing signal line is connected to first electrodes of the second-first switching transistor, the fifth-first switching transistor, and the eighth-first switching transistor;

the third testing signal line is connected to first electrodes of the third-first switching transistor, the sixth-first switching transistor, and the ninth-first switching transistor;

the first-first control signal line is connected to gate electrodes of the first-first switching transistor, the second-first switching transistor, and the third-first switching transistor;

the second-first control signal line is connected to gate electrodes of the fourth-first switching transistor, the fifth-first switching transistor, and the sixth-first switching transistor;

the third-first control signal line is connected to gate electrodes of the seventh-first switching transistor, an eighth-first switching transistor, and the ninth-first switching transistor;

the first-second control signal line is connected to gate electrodes of the first-second switching transistor, the fourth-second switching transistor, and the seventh-second switching transistor;

the second-second control signal line is connected to gate electrodes of the second-second switching transistor, the fifth-second switching transistor, and the eighth-second switching transistor; and the third-second control signal line is connected to gate electrodes of the third-second switching transistor, the sixth-second switching transistor, and the ninth-second switching transistor.

6. The array substrate of claim 1, comprising:
a semi-conductor material layer, wherein the semi-conductor material layer comprises active layers of the M number of first switching transistors and the M number of second switching transistors;
a first conductive layer, wherein the first conductive layer comprises gate electrodes of the M number of first switching transistors and the M number of second switching transistors;
a second conductive layer, wherein the second conductive layer comprises M number of first connecting lines respectively connecting first electrodes of the M number of first switching transistors to corresponding testing signal lines, and M number of second connecting lines respectively connecting second electrodes of the M number of first switching transistors to first electrodes of the M number of second switching transistors; and
a first signal line layer, wherein the first signal line layer comprises first sub-layers respectively of the N number of testing signal lines, the N number of first control signal lines, the N number of second control signal lines, first electrodes and second electrodes of the M number of first switching transistors, and first electrodes and second electrodes of the M number of second switching transistors.

7. The array substrate of claim 6, further comprising:
an insulating layer between the first conductive layer and the second conductive layer;
an inter-layer dielectric layer between the second conductive layer and the first signal line layer; and
a planarization layer between on a side of the first signal line layer away from the inter-layer dielectric layer;
wherein a respective first electrode of a respective first switching transistor is connected to a respective first connecting line through a via extending through the inter-layer dielectric layer;
a respective first sub-layer of a respective test signal line is connected to corresponding first connecting lines respective through vias extending through the inter-layer dielectric layer; and
a respective first control signal line is connected to corresponding gate electrodes of corresponding first switching transistors respectively through vias extending through the inter-layer dielectric layer and the insulating layer.

8. The array substrate of claim 7, wherein a respective second electrode of a respective first switching transistor is connected to a respective second connecting line through a via extending through the inter-layer dielectric layer;
a respective first electrode of a respective second switching transistor is connected to the respective second connecting line through a via extending through the inter-layer dielectric layer; and
a respective second control signal line is connected to corresponding gate electrodes of corresponding second switching transistors respectively through vias extending through the inter-layer dielectric layer and the insulating layer.

9. The array substrate of claim 6, further comprising:
a second signal line layer, wherein the second signal line layer comprises second sub-layers respectively of N number of testing signal lines; and
a planarization layer between the first signal line layer and the second signal line layer;
wherein a respective second sub-layer of a respective testing signal line is connected to a respective first sub-layer of the respective testing signal line through a via extending through the planarization layer.

10. The array substrate of claim 6, wherein a respective first electrode of a respective first switching transistor is connected to a respective active layer of the respective first switching transistor through a via extending through the inter-layer dielectric layer and the insulating layer;
a respective second electrode of a respective first switching transistor is connected to the respective active layer of the respective first switching transistor through a via extending through the inter-layer dielectric layer and the insulating layer;
a respective first electrode of a respective second switching transistor is connected to a respective active layer of the respective second switching transistor through a via extending through the inter-layer dielectric layer and the insulating layer; and
a respective second electrode of a respective second switching transistor is connected to the respective active layer of the respective second switching transistor through a via extending through the inter-layer dielectric layer and the insulating layer.

11. A display panel, comprising the array substrate of claim 1, and M number of array substrate signal lines respectively connected to second electrodes of the M number of second switching transistors.

12. The display panel of claim 11, wherein the M number of array substrate signal lines are M number of data lines.

13. A method of testing an array substrate, comprising:
providing a testing circuit comprising N number of testing signal lines, N being an integer greater than 1; N number of first control signal lines; N number of second control signal lines; M number of first switching transistors, M being an integer greater than N; and M number of second switching transistors;

connecting a second electrode of a m-th first switching transistor to a first electrode of a m-th second switching transistor, $1 \leq m \leq M$;

connecting a n-th testing signal line to first electrodes of (kN+n)-th first switching transistors, $1 \leq n \leq N$, $0 \leq k < M/N$;

connecting a n-th first control signal line to gate electrodes of $(kN^2+((n-1)*N)+1)$-th to $(kN^2+n*N)$-th first switching transistors, $0 \leq k < M/N$;

connecting a n-th second control signal line to gate electrodes of the (kN+n)-th second switching transistors; and connecting a second electrode of the m-th second switching transistor to a m-th array substrate signal line.

14. The method of claim 13, wherein the testing is performed in a cycle comprising N number of period;

wherein the method comprises, in a n-th period, providing a turning-on voltage signal to the n-th first control signal line while providing turning-off voltage signals to first control signal lines other than the n-th first control signal line, providing turning-on voltage signals respectively to the N number of second control signal lines, and providing testing voltage signals respectively to the N number of testing signal lines, thereby providing the testing voltage signals respectively to signal lines respectively connected to second electrodes of $(kN^2+((n-1)*N)+1)$-th to $(kN^2+n*N)$-th second switching transistors.

15. The method of claim 14, wherein N=3; and the cycle comprises a first period, a second period, and a third period.

16. The method of claim 15, wherein in the first period, the method comprises providing a turning-on voltage signal to a first-first control signal line while providing turning-off voltage signals to a second-first control signal line and a third-first control signal line, providing turning-on voltage signals respectively to a first-second control signal line, a second-second control signal line, and a third-second control signal line, and providing testing voltage signals respectively to a first testing signal line, a second testing signal line, and a third testing signal line, thereby providing the testing voltage signals respectively to signal lines respectively connected to second electrodes of a first-second switching transistor, a second-second switching transistor, and a third-second switching transistor;

in the second period, the method comprises providing a turning-on voltage signal to the second-first control signal line while providing turning-off voltage signals to the first-first control signal line and the third-first control signal line, providing turning-on voltage signals respectively to the first-second control signal line, the second-second control signal line, and the third-second control signal line, and providing testing voltage signals respectively to the first testing signal line, the second testing signal line, and the third testing signal line, thereby providing the testing voltage signals respectively to signal lines respectively connected to second electrodes of a fourth-second switching transistor, a fifth-second switching transistor, and a sixth-second switching transistor; and in the third period, the method comprises providing a turning-on voltage signal to the third-first control signal line while providing turning-off voltage signals to the first-first control signal line and the second-first control signal line, providing turning-on voltage signals respectively to the first-second control signal line, the second-second control signal line, and the third-second control signal line, and providing testing voltage signals respectively to the first testing signal line, the second testing signal line, and the third testing signal line, thereby providing the testing voltage signals respectively to signal lines respectively connected to second electrodes of a seventh-second switching transistor, an eighth-second switching transistor, and a ninth-second switching transistor.

17. The method of claim 13, wherein the testing is performed in a cycle comprising N number of period, a respective period comprising N number of sub-period;

wherein the method comprises, in a n-th period, providing a turning-on voltage signal to the n-th second control signal line while providing turning-off voltage signals to second control signal lines other than the n-th second control signal line, providing testing voltage signals respectively to the N number of testing signal lines;

in a n-th sub-period of the n-th period, providing a turning-on voltage signal to the n-th first control signal line while providing turning-off voltage signals to first control signal lines other than the n-th first control signal line, thereby providing the testing voltage signals respectively to signal lines connected to second electrodes of $(kN^2+((n-1)*N)+n)$-th second switching transistors.

18. The method of claim 17, wherein N=3;

the cycle comprises a first period, a second period, and a third period;

the first period comprises a first-first sub-period, a second-first sub-period, and a third-first sub-period;

the second period comprises a first-second sub-period, a second-second sub-period, and a third-second sub-period; and the third period comprises a first-third sub-period, a second-third sub-period, and a third-third sub-period.

19. The method of claim 18, wherein in the first period, the method comprises providing a turning-on voltage signal to a first-second control signal line while providing turning-off voltage signals to a second-second control signal line and a third-second control signal line, providing testing voltage signals respectively to a first testing signal line, a second testing signal line, and a third testing signal line;

in the first-first sub-period, the method comprises providing a turning-on voltage signal to a first-first control signal line while providing turning-off voltage signals to a second-first control signal line and a third-first control signal line, thereby providing the testing voltage signals respectively to signal lines connected to a second electrode of a first-second switching transistor;

in the second-first sub-period, the method comprises providing a turning-on voltage signal to the second-first control signal line while providing turning-off voltage signals to the first-first control signal line and the third-first control signal line, thereby providing the testing voltage signals respectively to signal lines connected to a second electrode of a fourth-second switching transistor;

in the third-first sub-period, the method comprises providing a turning-on voltage signal to the third-first control signal line while providing turning-off voltage signals to the first-first control signal line and the second-first control signal line, thereby providing the testing voltage signals respectively to signal lines connected to a second electrode of a seventh-second switching transistor;

in the second period, the method comprises providing a turning-on voltage signal to the second-second control signal line while providing turning-off voltage signals to the first-second control signal line and the third-second control signal line, providing testing voltage signals respectively to the first testing signal line, the second testing signal line, and the third testing signal line;

in the first-second sub-period, the method comprises providing a turning-on voltage signal to the first-first control signal line while providing turning-off voltage signals to the second-first control signal line and the third-first control signal line, thereby providing the testing voltage signals respectively to signal lines connected to a second electrode of a second-second switching transistor;

in the second-second sub-period, the method comprises providing a turning-on voltage signal to the second-first control signal line while providing turning-off voltage signals to the first-first control signal line and the third-first control signal line, thereby providing the testing voltage signals respectively to signal lines connected to a second electrode of a fifth-second switching transistor;

in the third-second sub-period, the method comprises providing a turning-on voltage signal to the third-first control signal line while providing turning-off voltage signals to the first-first control signal line and the second-first control signal line, thereby providing the testing voltage signals respectively to signal lines connected to a second electrode of an eighth-second switching transistor;

in the third period, the method comprises providing a turning-on voltage signal to the third-second control signal line while providing turning-off voltage signals to the first-second control signal line and the second-second control signal line, providing testing voltage signals respectively to the first testing signal line, the second testing signal line, and the third testing signal line;

in the first-third sub-period, the method comprises providing a turning-on voltage signal to the first-first control signal line while providing turning-off voltage signals to the second-first control signal line and the third-first control signal line, thereby providing the testing voltage signals respectively to signal lines connected to a second electrode of a third-second switching transistor;

in the second-third sub-period, the method comprises providing a turning-on voltage signal to the second-first control signal line while providing turning-off voltage signals to the first-first control signal line and the third-first control signal line, thereby providing the testing voltage signals respectively to signal lines connected to a second electrode of a sixth-second switching transistor; and in the third-third sub-period, the method comprises providing a turning-on voltage signal to the third-first control signal line while providing turning-off voltage signals to the first-first control signal line and the second-first control signal line, thereby providing the testing voltage signals respectively to signal lines connected to a second electrode of a ninth-second switching transistor.

20. The method of claim 13, wherein the array substrate further comprises M number of array substrate signal lines respectively connected to second electrodes of the M number of second switching transistors, wherein the M number of array substrate signal lines are M number of data lines.

\* \* \* \* \*